(12) United States Patent
Hong et al.

(10) Patent No.: US 7,205,623 B2
(45) Date of Patent: Apr. 17, 2007

(54) IMAGE SENSOR AND METHOD OF MANUFACTURING SAME

(75) Inventors: Jong-Wook Hong, Yongin-si (KR); Jong-Cheol Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/229,764

(22) Filed: Sep. 20, 2005

(65) Prior Publication Data

US 2006/0060899 A1     Mar. 23, 2006

(30) Foreign Application Priority Data

Sep. 23, 2004  (KR) ...................... 10-2004-0076547

(51) Int. Cl.
*H01L 31/0232*     (2006.01)
(52) U.S. Cl. ...................... 257/435; 257/414; 257/428; 257/431; 257/E31.127; 438/48; 438/57; 438/69
(58) Field of Classification Search ...................... None
See application file for complete search history.

(56) References Cited

U.S. PATENT DOCUMENTS 6,235,549 B1 *  5/2001  Bawolek et al. .............. 438/48

FOREIGN PATENT DOCUMENTS

| JP | 08-250694 | 9/1996 |
|---|---|---|
| JP | 2000-091553 | 3/2000 |
| KR | 1020000003031 | 1/2000 |

* cited by examiner

*Primary Examiner*—Leonardo Andujar
*Assistant Examiner*—Kevin Quinto
(74) *Attorney, Agent, or Firm*—Volentine & Whitt, PLLC

(57) ABSTRACT

An image sensor includes a photodiode formed in substrate, an insulating interlayer structure formed on the substrate, a metal structure formed in the insulating interlayer structure, a dummy pattern formed on the insulating interlayer structure, and a light-shielding layer pattern enclosing the dummy pattern. The dummy pattern is at least partially overlapped by the metal structure and the light-shielding layer pattern is at least partially overlapped by the photodiode.

32 Claims, 20 Drawing Sheets

IMAGE SENSOR AND METHOD OF MANUFACTURING SAME

BACKGROUND OF THE INVENTION

1. Field of the Invention

The present invention relates generally to an image sensor and a method of manufacturing the same. More particularly, the invention relates to an image sensor having enhanced electrical characteristics, and a method of manufacturing the same.

A claim of priority is made to Korean Patent Application No. 2004-76547 filed on Sep. 23, 2004, the disclosure of which is hereby incorporated by reference in its entirety.

2. Description of the Related Art

Image sensors are included in a wide array of modern electronic devices. For example, image sensors can be found in digital cameras, personal digital assistants (PDAs), and mobile phones, to name but a few.

The two most popular types of image sensors used in contemporary electronic devices are charge coupled device (CCD) image sensors, and complementary metal oxide semiconductor (CMOS) image sensors. Both types of image sensors convert optical signals into electrical charges and then convert the electrical charges into voltages representing an image. However, there are differences in the way these functions are performed.

In CCD image sensors, the optical signals are converted into electrical charges on one chip, and the electrical charges are converted into voltages by elements (e.g., amplifiers, buffers, drivers, etc.) on a printed circuit board attached to the chip. In contrast, in CMOS image sensors, the optical signals are converted into electrical charges and the electrical charges are converted into voltages all on a single chip.

A pixel sensor (i.e., an apparatus used to generate a single pixel of an image) in a CMOS image sensor typically comprises a photodiode generating electrical charges in response to incident light and a CMOS logic circuit converting the electrical charges into voltages representing an image (i.e., pixel voltages).

Unfortunately, the photodiode tends to generate additional electrical charges due to heat. In order to minimize image noise caused by heat-generated electrical charges, the heat-generated electrical charges ought to be excluded from the pixel voltages. One way to eliminate heat-generated electrical charges from the pixel voltages is to include pixel sensors in the CMOS image sensor with a light shielding layer covering their photodiodes. An area of the CMOS image sensor having pixel sensors covered by the light shielding layer is called an "optical black area" (OBA) and an area of the CMOS image sensor having pixel sensors not covered by the light shielding layer is called an "optical acceptance area" (OAA).

Pixel sensors in the optical black area generate electrical charges by heat but not light. Accordingly, a voltage generated by these pixel sensors serves as a "reference signal(s)" for approximating the amount of heat-generated electrical charges in pixel sensors of the optical acceptance area. The reference signal(s) generated by pixel sensors in the optical black area of the CMOS image sensor can be subtracted from pixel voltages in order to exclude any contribution made by electrical charges generated by heat alone.

Where the light-shielding layer is thin or partially removed from the optical black area, light may be partially irradiated onto photodiodes contained therein. As a result of this irradiated light, charges may be generated in pixel sensors of the optical black area. In general, this increases the amount of electrical charges generated by the pixel sensors in the optical black area, making the resulting reference signal(s) a poor indication of the amount of electrons generated by heat. In other words, it makes the reference signal noisy. Of course, using a noisy reference signal(s) to generate pixel voltages tends to lower the quality of images resulting from the pixel voltages.

Copper (Cu) is generally used to form wiring and light-shielding layers for image sensors because copper has lower electrical resistance than aluminum (Al) or tungsten (W). Copper wiring and light shielding layers for image sensors are typically formed by a damascene process. Unfortunately, the damascene process often causes dishing to occur in the light-shielding layer. The term "dishing" denotes a thinning or non-uniform formation of a portion or portions of the light-shielding layer.

FIG. 1 is a cross-sectional view of a conventional image sensor having a copper light-shielding layer in which dishing occurs.

Referring to FIG. 1, a copper light-shielding layer 10 has a thin portion 12 in an optical black area "I" of a CMOS image sensor but not in an optical acceptance area "II". Thin portion 12 is caused by a damascene process used to form light-shielding layer 10. Where light-shielding layer 10 has thin portion 12, light may pass through thin portion 12 of light-shielding layer 10, causing reference signals generated by the image sensor to be noisy. As a result, the quality of images produced by the image sensor may be compromised.

SUMMARY OF THE INVENTION

According to one embodiment of the invention, an image sensor is provided. The image sensor comprises a photodiode formed in a substrate, an insulating interlayer structure formed on the substrate, a metal structure formed in the insulating interlayer structure, a dummy pattern at least partially overlapping the metal structure and formed on the insulating interlayer structure, and an upper light-shielding layer pattern at least partially overlapped by the photodiode and enclosing the dummy pattern.

According to another embodiment of the invention, another image sensor is provided. The image sensor comprises a first photodiode formed in an optical black area of a substrate, a second photodiode formed in an optical acceptance area of the substrate, an insulating interlayer structure formed on the substrate, a plurality of wirings formed in the insulating interlayer structure, a plurality of lower light-shielding layer patterns at least partially overlapped by the first photodiode and electrically insulated from the wirings, formed in the insulating interlayer structure, at least one dummy pattern overlapping the lower light-shielding patterns and formed on the insulating interlayer structure, and an upper light-shielding layer pattern at least partially overlapped by the first photodiode and enclosing the dummy pattern.

According to still another embodiment of the present invention, a method of manufacturing an image sensor is provided. The method comprises forming a photodiode in a substrate, forming an insulating interlayer structure comprising at least one insulating interlayer on the substrate, forming a metal structure in the insulating interlayer structure, forming a dummy pattern at least partially overlapping the metal structure on the insulating interlayer structure, and forming an upper light-shielding layer pattern at least partially overlapped by the photodiode and enclosing the dummy pattern.

According to yet another embodiment of the invention, another method of manufacturing an image sensor is provided. The method comprises forming a first photodiode in an optical black area of a substrate, forming a second photodiode in an optical acceptance area of the substrate, forming an insulating interlayer structure comprising at least one insulating interlayer on the substrate, forming wirings in the insulating interlayer structure and offset from the photodiodes, and forming lower light-shielding layer patterns in the insulating interlayer structure. The lower light-shielding layer patterns are at least partially overlapped by the first photodiode and electrically insulated from the wirings. The method further comprises forming at least one dummy pattern on the insulating interlayer structure and in the optical black area, and forming an upper light-shielding layer pattern enclosing the dummy pattern. The upper light-shielding layer pattern is at least partially overlapped by the first photodiode.

BRIEF DESCRIPTION OF THE DRAWINGS

The invention is described below in relation to several embodiments illustrated in the accompanying drawings. Throughout the drawings like reference numbers indicate like exemplary elements, components, or steps. In addition, the dimensions and thickness of layers in the drawings is exaggerated for clarity. In the drawings.

DETAILED DESCRIPTION OF THE INVENTION

Exemplary embodiments of the invention are described below with reference to the corresponding drawings. These embodiments are presented as teaching examples. The actual scope of the invention is defined by the claims that follow.

In this written description, the terms "on" and "onto", "over", etc., are variously used to describe relative placement of layers in an apparatus. For example, a layer formed "on" or "onto" another layer may be directly on top of the other layer, or other layers or elements may exist between the layers.

Figure 1:
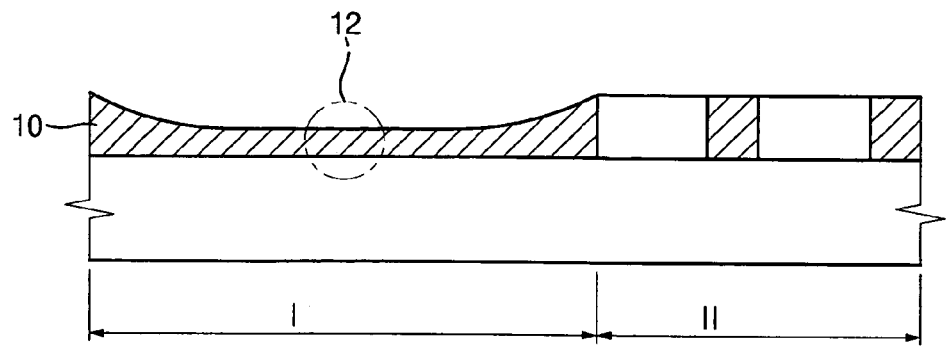
FIG. 1 is a cross-sectional view illustrating a conventional image sensor having a copper light-shielding layer in which dishing has occurred.
Figure 2:
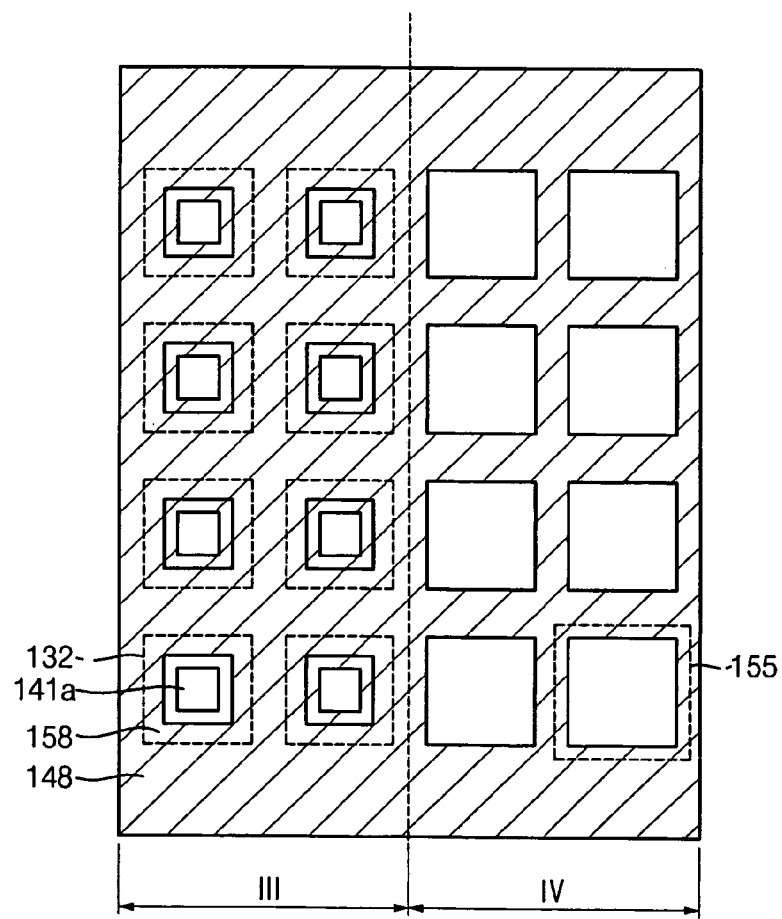
FIG. 2 is a planar view illustrating an image sensor in accordance with one embodiment of the present invention.
Figure 3:
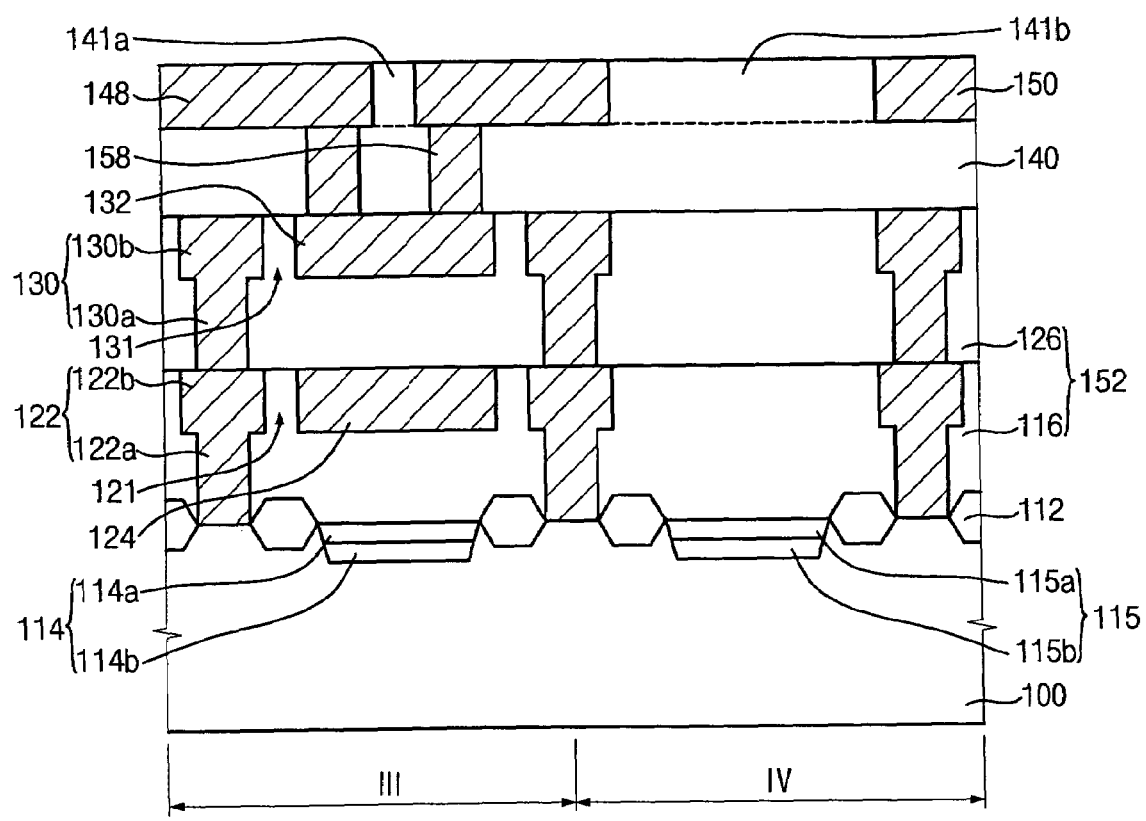
FIG. 3 is a cross-sectional view illustrating the image sensor in FIG. 2.

FIG. 2 is a planar view illustrating an image sensor according to one embodiment of the invention and FIG. 3 is a cross-sectional view of the image sensor in FIG. 2.

Referring to FIGS. 2 and 3, the image sensor comprises optical black area "III" and optical acceptance area "IV". The image sensor comprises a plurality of pixel sensors 155 formed on substrate 100 in optical black area III and optical acceptance area IV. Pixel sensors 155 are electrically isolated from one another other by an isolation layer 112. Each of pixel sensors 155 has a substantially identical construction. For example, each of pixel sensors 155 comprises at least one photodiode 114 or 115 and four transistors (not shown).

First and second photodiodes 114 and 115 are formed at upper portions of substrate 100. First photodiode 114 typically includes a P-type impurity region 114a and an N-type impurity region 114b and second photodiode 115 typically includes a P-type impurity region 115a and an N-type impurity region 115b. Alternatively, first photodiode 114 may include N-type impurity 114b region only, and also second photodiode 115 may include N-type impurity region 115b only.

Typically, each of pixel sensors 155 further comprises a first transistor, a second transistor, a third transistor, and a fourth transistor. The first transistor typically resets first or second photodiode 114 or 115 after receiving a reset signal, and the second transistor typically amplifies an electrical signal corresponding to electrical charges accumulated in first or second photodiode 114 or 115.

The first and second transistors serve as a reset transistor and an amplifying transistor, respectively. The third transistor activates the amplifying transistor after receiving a select signal, and the fourth transistor transfers electrical charges accumulated in first or second photodiode 114 or 115 toward a floating diffusion region of the image sensor. Thus, the third and the fourth transistors function as a selection transistor and a transfer transistor, respectively.

Insulating interlayer structure 152 is formed on substrate 100. Insulating interlayer structure 152 comprises at least one insulating interlayer. For example, in FIG. 3, insulating interlayer structure 152 includes first insulating interlayer 116 and second insulating interlayer 126. Additional insulating interlayers such as third insulating interlayer 140 and fourth insulating interlayer 141b are formed on insulating interlayer structure 152 as shown in FIG. 3. First and second insulating interlayers 116 and 126 are referred to herein as lower insulating interlayers, and third and fourth insulating interlayers 140 and 141b are referred to as upper insulating interlayers.

Light from an outside source reaches second photodiode 115 through insulating interlayer structure 152. Thus, insulating interlayer structure 152 typically includes a transparent insulating material. For example, each of first through fourth insulating interlayers 116, 126, 140 and 141b typically includes an oxide containing silicon.

The image sensor further comprises a metal structure comprising first wirings 122, first lower light-shielding layer pattern 124, second wirings 130 and second lower light-shielding layer pattern 132.

First wirings 122 are positioned in optical black area III and optical acceptance area IV through first insulating interlayer 116. First wirings 122 in optical acceptance area IV are not formed directly over second photodiode 115. In other words, first wirings 122 in optical acceptance area IV are formed in portions of first insulating interlayer 116 under which second photodiode 115 is not positioned.

Second wirings 130 are formed in optical black area III and optical acceptance area IV through second insulating interlayer 126. As with first wirings 122, second wirings 130 in optical acceptance area IV are not positioned directly over second photodiode 115 so as to permit light from the outside source to reach second photodiode 115 through first and second insulating interlayers 116 and 126.

Each of first wirings 122 includes first contact 122a and first subsidiary wiring 122b. First contact 122a makes contact with a portion of substrate 100 and first subsidiary wiring 122b is formed on first contact 122a so as to electrically connect first contact 122a to an adjacent first contact. First subsidiary wiring 122b typically has a line shape.

Each of second wirings 130 comprises second contact 130a and second subsidiary wiring 130b. Second contact 130a makes contact with first wiring 122, and second subsidiary wiring 130b electrically connects second contact 130a to an adjacent second contact.

First and second light-shielding layer patterns 124 and 132 are formed in insulating interlayer structure 152. First light-shielding layer pattern 124 is formed at an upper portion of first insulating interlayer 116 in optical black area III, and second light-shielding layer pattern 132 is positioned at an upper portion of second insulating interlayer 126 in optical black area III. However, first and second light-shielding layer patterns 124 and 132 are not formed in optical acceptance area IV. To prevent light from irradiating onto first photodiode 114 in optical black area III, first and second light-shielding layer patterns 124 and 132 are at least partially overlapped with first photodiode 114.

First light-shielding layer pattern 124 and first subsidiary wiring 122b are preferably separated from substrate 100 by substantially identical distances. Since light may pass through a first gap 121 between first light-shielding layer pattern 124 and first subsidiary wiring 122b, first light-shielding layer pattern 124 is formed close to first subsidiary wiring 122b to minimize the size of first gap 121. Second light-shielding layer pattern 132 and second subsidiary wiring 130b are also separated from substrate 100 by substantially identical distances. Second light-shielding layer pattern 132 is likewise formed close to second subsidiary wiring 130b to minimize a second gap 131 between second light-shielding layer pattern 132 and second subsidiary wiring 130b.

Preferably, each of first wirings 122 comprises a metal substantially identical to that of first light-shielding layer pattern 124. In addition, each of second wirings 130 preferably includes a metal substantially identical to that of second light-shielding layer pattern 132. For example, each of first wirings 122 and first light-shielding layer pattern 124 includes a metal having a low electrical resistance such as copper (Cu). Each of second wirings 130 and second light-shielding layer pattern 132 may also include copper.

Where first and second wirings 122 and 130 include copper, first and second subsidiary wirings 122b and 130b are typically formed with a small thickness because copper has an electrical resistance lower than that of aluminum (Al) or tungsten (W). For example, first and second subsidiary wirings 122b and 130b including copper have a thickness of about one-third or one-fourth that of an aluminum wiring with the same overall electrical resistance. More specifically, first and second subsidiary wirings 122b and 130b made of copper could have thickness of about 1,000 to 3,000 Å, respectively.

Insulating interlayer structure 152 may have a much smaller thickness than conventional insulating interlayers when the plurality of wirings including thin subsidiary wirings of copper is formed over substrate 100. Accordingly, second photodiode 115 generally has an improved light sensitivity because the length of a path from the outside source to second photodiode 115 is considerably reduced.

Insulating interlayer structure 152 further comprises third insulating interlayer 140 formed on second insulating interlayer 126. Preferably, third insulating interlayer 140 typically comprises a transparent insulation material. For example, third insulating interlayer 140 may comprise an oxide containing silicon.

Dummy pattern 141a is formed on third insulating interlayer 140 in optical black area III. Preferably, dummy pattern 141a is at least partially overlapped with second light-shielding layer pattern 132. Dummy pattern 141a typically includes a material substantially identical to that of third insulating interlayer 140. Dummy pattern 141a generally has a size substantially smaller than second light-shielding layer pattern 132.

In optical black area III, at least one upper light-shielding layer pattern 148 is formed on third insulating interlayer 140 to enclose dummy pattern 141a. Preferably, upper light-shielding layer pattern 148 entirely covers optical black area III and blocks light from irradiating into optical black area III except for through dummy pattern 141a.

Light-shielding via pattern 158 is formed in third insulating interlayer 140. Light-shielding via pattern 158 is vertically formed in third insulating interlayer 140 so as to connect second light-shielding layer pattern 132 to upper light-shielding layer pattern 148. As shown in FIG. 2, light-shielding via pattern 158 encloses a lower portion of the dummy pattern 141a. Light-shielding via pattern 158 may have a pipe shape providing a space in which dummy pattern 141a is formed.

The upper portion of dummy pattern 141a is buried in upper light-shielding layer pattern 148, and the lower portion of dummy pattern 141a is enclosed by light-shielding via pattern 158. Accordingly, although light may pass through dummy pattern 141a, the light will be blocked by light-shielding via pattern 158 and second light-shielding layer pattern 132 so that the light does not reach first photodiode 114 in optical black area III. In addition, first light-shielding layer pattern 124 also provides a layer of protection preventing light from irradiating onto first photodiode 114.

In optical acceptance area IV, at least one upper wiring 150 is formed on third insulating interlayer 140. Fourth insulating interlayer 141b is formed on third insulating interlayer 140 between upper wiring 150 and upper light-shielding layer pattern 148. Fourth insulating interlayer 141b typically includes a material substantially identical to that of third insulating interlayer 140. Preferably, upper wiring 150 does not overlap with second photodiode 115 so that light may reach second photodiode 115 through first through fourth insulating interlayers 116, 126, 140 and 141b. Preferably, upper light-shielding layer pattern 148 and upper wiring 150 include a metal having a low electrical resistance such as copper.

Dummy pattern 141a generally prevents dishing from occurring in upper light-shielding layer pattern 148 and upper wiring 150 as a result of a chemical mechanical polishing (CMP) process used to form upper light-shielding layer pattern 148 and upper wiring 150. In other words, dummy pattern 141a helps to form upper light-shielding layer pattern 148 and upper wiring 150 with a uniform thickness. In order to further prevent the possibility of dishing in upper light-shielding layer pattern 148 and upper wiring 150, a plurality of the dummy patterns may be formed throughout optical black area III.

Because second light-shielding layer pattern 132 and light shielding pattern 158 are formed beneath dummy pattern 141a to prevent light from penetrating optical black area III, first light-shielding layer pattern 124 may be omitted. In other words, the construction of insulating interlayer structure 152 may be simplified.

Figure 4:
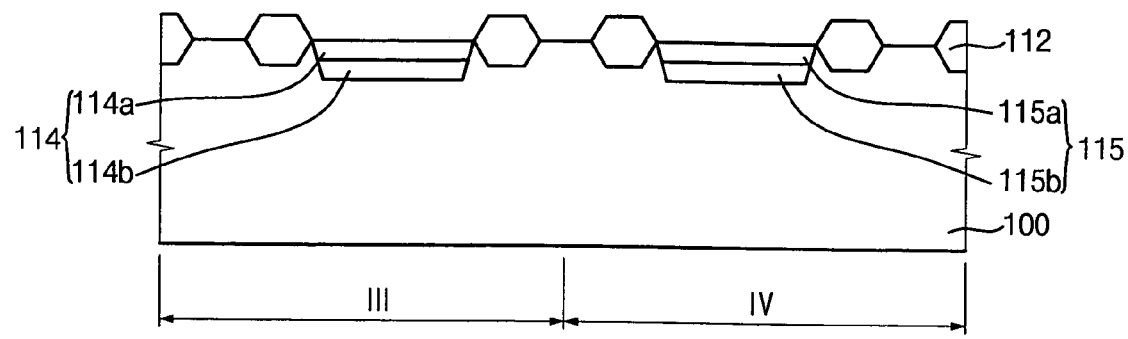
FIGS. 4 through 6 and 8 through 10 are cross-sectional views illustrating a method of manufacturing an image sensor in accordance with an embodiment of the present invention.
Figure 5:
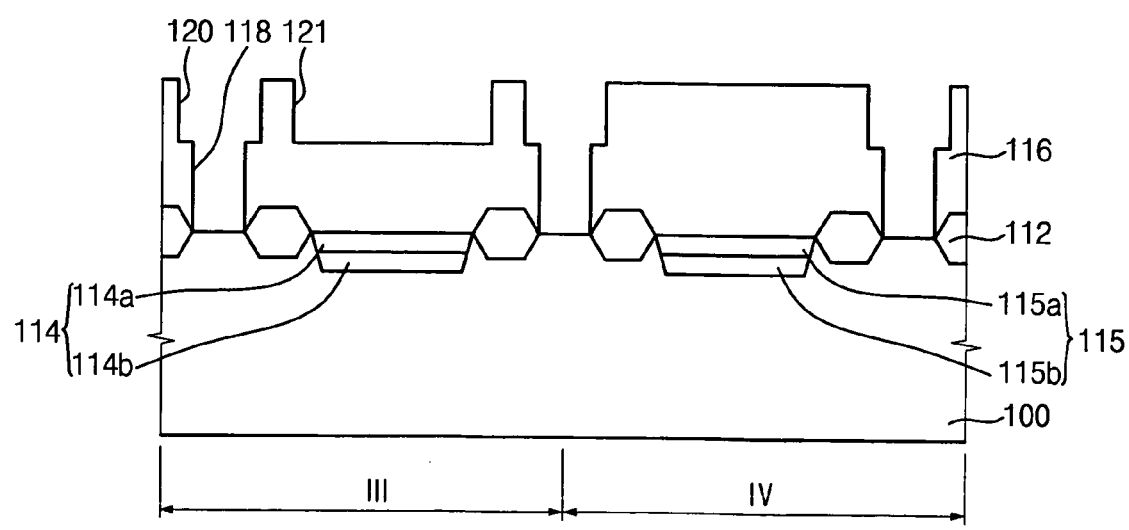
Figure 6:
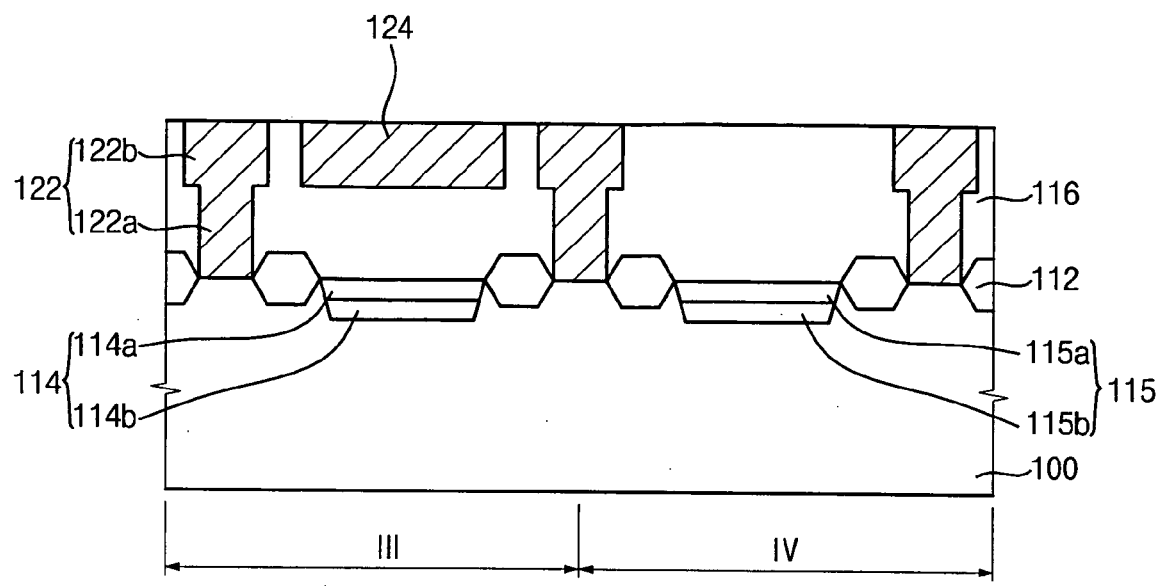
Figure 7:
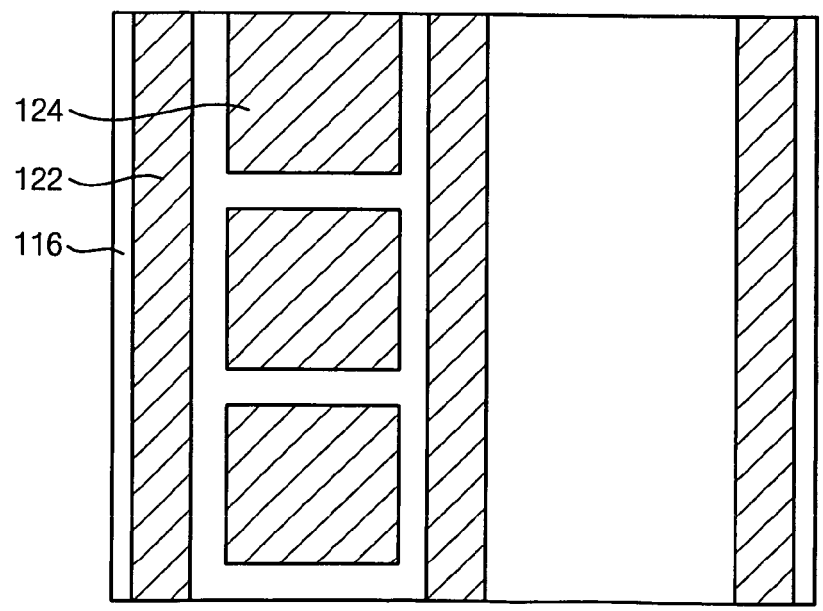
FIG. 7 is a planar view illustrating the method of manufacturing the image sensor shown in FIG. 6.

FIGS. 4 through 6 and 8 through 10 are cross-sectional views illustrating a method of manufacturing an image sensor in accordance with selected embodiments of the present invention and FIG. 7 is a planar view illustrating a method of manufacturing an image sensor in FIG. 6.

FIG. 4 is a cross-sectional view illustrating the formation of an isolation layer 112, a first photodiode 114 and a second photodiode 115.

Referring to FIG. 4, semiconductor substrate 100 is divided into optical black area III and optical acceptance area IV. Pixel sensors are formed in optical black area III and optical acceptance area IV of substrate 100. Each of the pixel sensors typically includes one photodiode and four transistors.

Semiconductor substrate 100 generally includes a silicon wafer or a silicon-on-insulator (SOI) substrate. Semiconductor substrate 100 is preferably doped with P-type impurities. In other words, semiconductor substrate 100 is preferably P-type.

Isolation layer 112 is formed on substrate 100 to define active regions and field regions on substrate 100. Isolation layer 112 is typically formed by an isolation process such as a shallow trench isolation (STI) process or a local oxidation of silicon (LOCOS) process.

N-type impurity regions 114b and 115b are formed at upper portions of substrate 100. N-type impurity regions 114b and 115b are typically formed by implanting N-type impurities into the upper portions of substrate 100. P-type impurity regions 114a and 115a are formed on N-type impurity regions 114b and 115b, respectively. Alternatively, P-type impurity regions 114a and 115a may also be formed by implanting P-type impurities into upper portions of substrate 100 on N-type impurity regions 114b and 115b. As a result, first photodiode 114 including P-type impurity region 114a and the N-type impurity region 114b is formed in optical black area III, and second photodiode 115 having the P-type impurity region 115a and N-type impurity region 115b is formed in optical acceptance area IV Transistors (not shown) associated with first and second photodiodes 114 and 115 are also formed on substrate 100.

FIG. 5 is a cross-sectional view illustrating the formation of a first insulating interlayer 116, first contact holes 118 and first trenches 120.

Referring to FIG. 5, first insulating interlayer 116 is formed on substrate 100 over isolation layer 112, first and second photodiodes 114 and 115, and transistors associated with first and second photodiodes 114 and 115. First insulating interlayer 116 is preferably formed using a transparent insulation material. For example, first insulating interlayer 116 is preferably formed using an oxide containing silicon.

A first photoresist pattern (not shown) is formed on first insulating interlayer 116. First insulating interlayer 116 is selectively etched using the first photoresist pattern as an etching mask to form first trenches 120 and second trench 121 at an upper portion of first insulating interlayer 116. Here, second trench 121 is formed in optical black area III only. First and second trenches 120 and 121 are used to form first subsidiary wirings 122b (see FIG. 6) and first light-shielding layer pattern 124 (see FIG. 6), respectively. Second trench 121 is formed at the upper portion of first insulating interlayer 116 partially overlapping first photodiode 114 in optical black area III.

Since first subsidiary wirings 122b are formed in first trenches 120, first trenches 120 have a depth substantially larger than the thickness of the first subsidiary wirings 122b. Similarly, second trench 121 has a depth substantially larger than the thickness of first light-shielding layer pattern 124. For example, each of first and second trenches 120 and 121 has a depth of about 1,000 to about 4,000 Å. First trenches 120 and second trench 121 are generally formed simultaneously.

The first photoresist pattern is generally removed by an ashing process and/or a stripping process. Then, a second photoresist pattern (not shown) is formed on first insulating interlayer 116. Using the second photoresist pattern as an etching mask, portions of first insulating interlayer 116 exposed by first trenches 120 are etched to form first contact holes 118 exposing substrate 100. Each of first contact holes 118 are connected to first trenches 120 in optical black area III and optical acceptance area IV The second photoresist pattern may be removed by an ashing process and/or a stripping process.

After first contact holes 118 are formed in first insulating interlayer 116, first trenches 120 may be formed on first contact holes 118, respectively. Here, second trench 121 is generally formed simultaneously with first trenches 120.

FIGS. 6 and 7 are a cross-sectional view and a planar view illustrating the formation of first wirings 122 and first light-shielding layer pattern 124.

Referring to FIGS. 6 and 7, a diffusion barrier layer (not shown) is formed on first insulating interlayer 116, on exposed portions of substrate 100, on sidewalls of first contact holes 118, on sidewalls of first trenches 120, and on a bottom and sidewalls of second trench 121. The diffusion barrier layer inhibits copper atoms included in first wiring 122 and first light-shielding layer pattern 124 from diffusing into substrate 100 and/or into first insulating interlayer 116. The diffusion barrier layer is typically formed using a metal such as titanium (Ti) or a metal nitride such as titanium nitride (TiN). Alternatively, the diffusion barrier layer may have a double layer structure including a titanium film and a titanium nitride film.

A first conductive layer including copper is formed on the diffusion barrier layer to fill up first contact holes 118, first trenches 120 and second trench 121. The first conductive layer is typically formed by an electroplating process or an electroless plating process.

The first conductive layer including copper is partially etched until the diffusion barrier layer is exposed to form first contacts 122a, first subsidiary wirings 122b and first light-shielding layer pattern 124. The first conductive layer may be partially removed by a CMP process, an etch-back process or a combination of a CMP process and an etch-back process. Thus, first wirings 122 including first contacts 122a and first subsidiary wirings 122b are formed on substrate 100. Preferably, first subsidiary wirings 122b and first light-shielding layer pattern 124 have a thickness of about 1,000 to about 3,000 Å.

Figure 8:
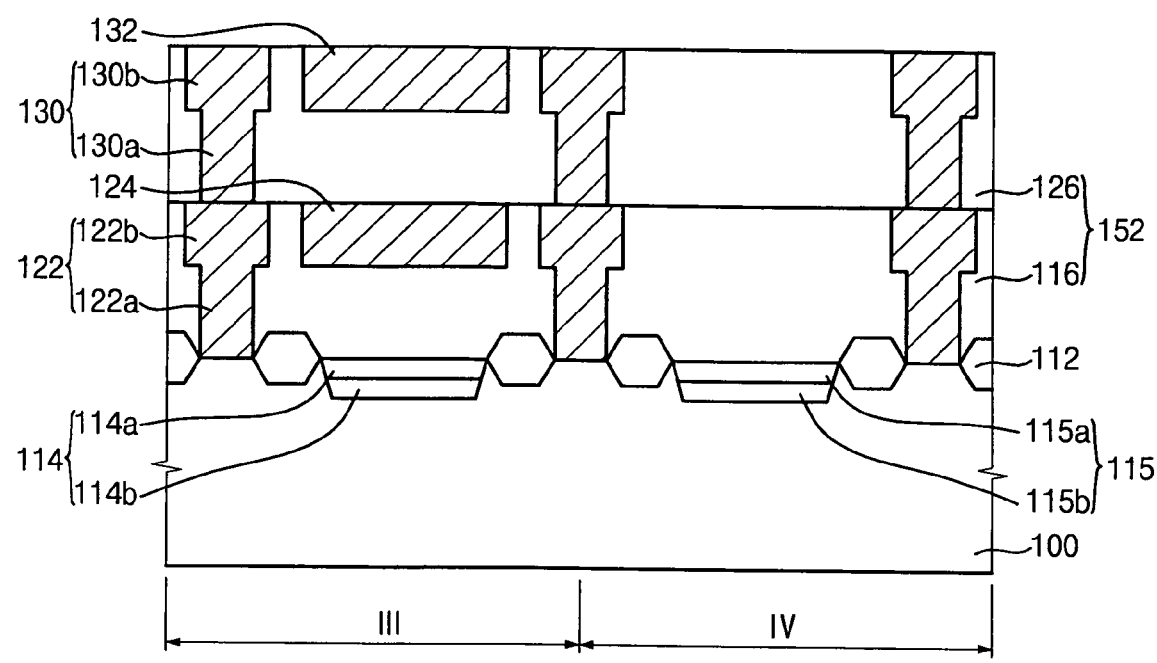

FIG. 8 is a cross-sectional view illustrating the formation of second wirings 130 and second light-shielding layer pattern 132.

Referring to FIG. 8, second insulating interlayer 126 is formed on first insulating interlayer 116, first wiring 122 and first light-shielding layer pattern 124. Second insulating interlayer 126 is preferably formed using a transparent insulation material. For example, second insulating interlayer 126 is typically formed using oxide containing silicon.

By processes substantially the same as those described with reference to FIGS. 5 to 7, second wirings 130 and second light-shielding layer pattern 132 are formed by forming a second conductive layer including copper, and then by partially removing the second conductive layer. Second wirings 130 include second contacts 130a and second subsidiary wirings 130b in optical black area III and optical acceptance area IV. Second contacts 130 are formed in second insulating interlayer 126 to make contact with first subsidiary wirings 122b. Second subsidiary wirings 130b are positioned on second contacts 130a. Second light-shielding layer pattern 132 is formed over first photodiode 114 in optical black area III. Second light-shielding layer pattern 132 is generally at least partially overlapped by first photodiode 114.

Figure 9:
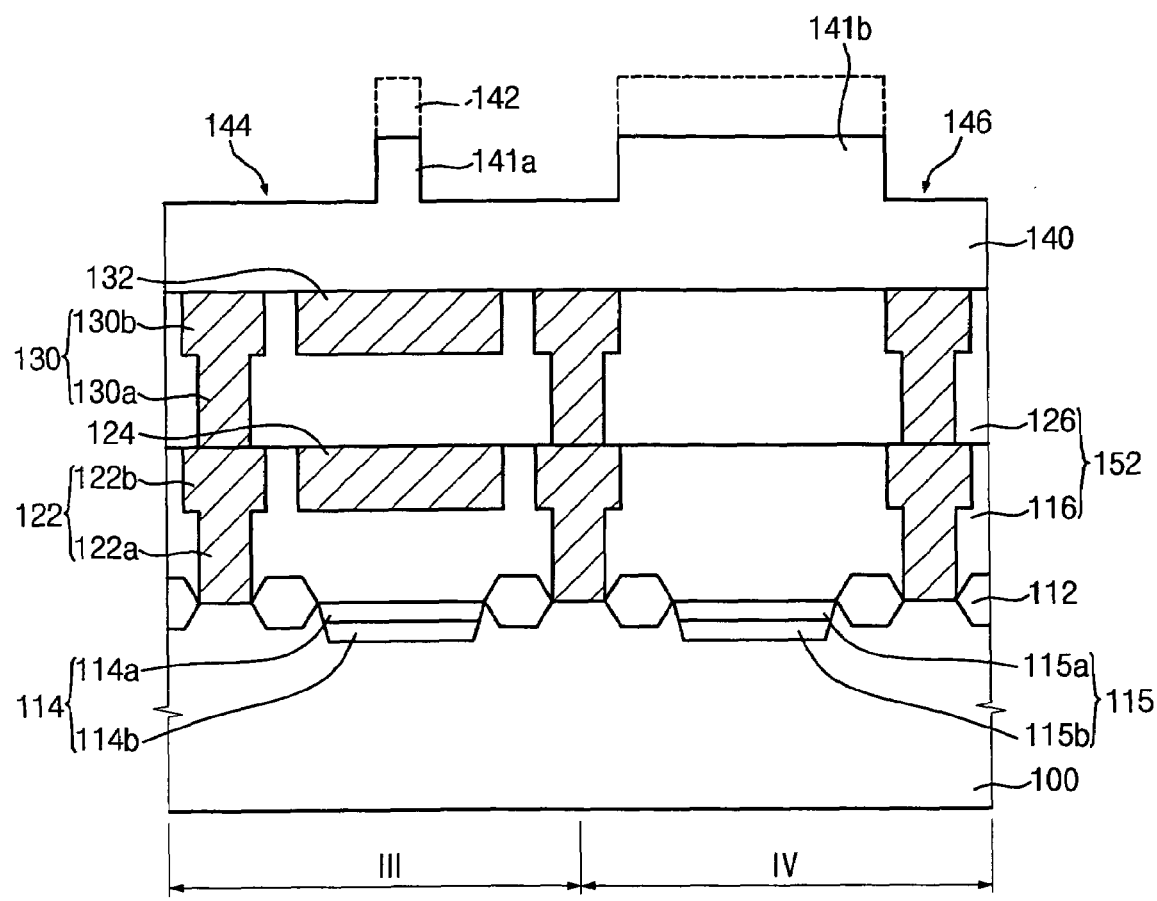

FIG. 9 is a cross-sectional view illustrating the formation of third insulating interlayer 140, dummy pattern 141a, fourth insulating interlayer 141b, first upper trench 144 and second upper trench 146.

Referring to FIG. 9, a preliminary third insulating interlayer (not shown) is formed on second insulating interlayer 126, second light-shielding layer pattern 132 and second wirings 130. The preliminary third insulating interlayer is preferably formed using a transparent insulation material. For example, the preliminary third insulating interlayer may be formed using an oxide containing silicon.

Third photoresist pattern 142 is formed on the preliminary third insulating interlayer. Third photoresist pattern 142 masks portions of the preliminary third insulating interlayer where fourth insulating interlayer 141b and dummy pattern 141a are formed. On the other hand, third photoresist pattern 142 exposes portions of the preliminary third insulating interlayer where upper light-shielding layer pattern 148 (see FIG. 3) and upper wiring 150 (see FIG. 3) are formed.

The exposed potions of the preliminary third insulating interlayer are etched using third photoresist pattern 142 as an etching mask. Thus, first upper trench 144 and second upper trench 146 are formed at upper portions of the preliminary third insulating interlayer so that second insulating interlayer 126 is not exposed after forming first and second upper trenches 144 and 146. First and second upper trenches 144 and 146 are provided for upper light-shielding layer pattern 148 and upper wiring 150, respectively.

Dummy pattern 141a is formed adjacent to first upper trench 144, and fourth insulating interlayer 141b is formed between first upper trench 144 and second upper trench 146. Dummy pattern 141a is positioned in optical black area III, and fourth insulating interlayer 141b is disposed in optical acceptance area IV. In addition, third insulating interlayer 140 is formed beneath first and second upper trenches 144 and 146 and fourth insulating interlayer 141b.

Dummy pattern 141a is at least partially overlapped by second light-shielding layer pattern 132, whereas second upper trench 146 is not overlapped with second photodiode 115. Third photoresist pattern 142 is typically removed by an ashing and/or a stripping process.

Figure 10:
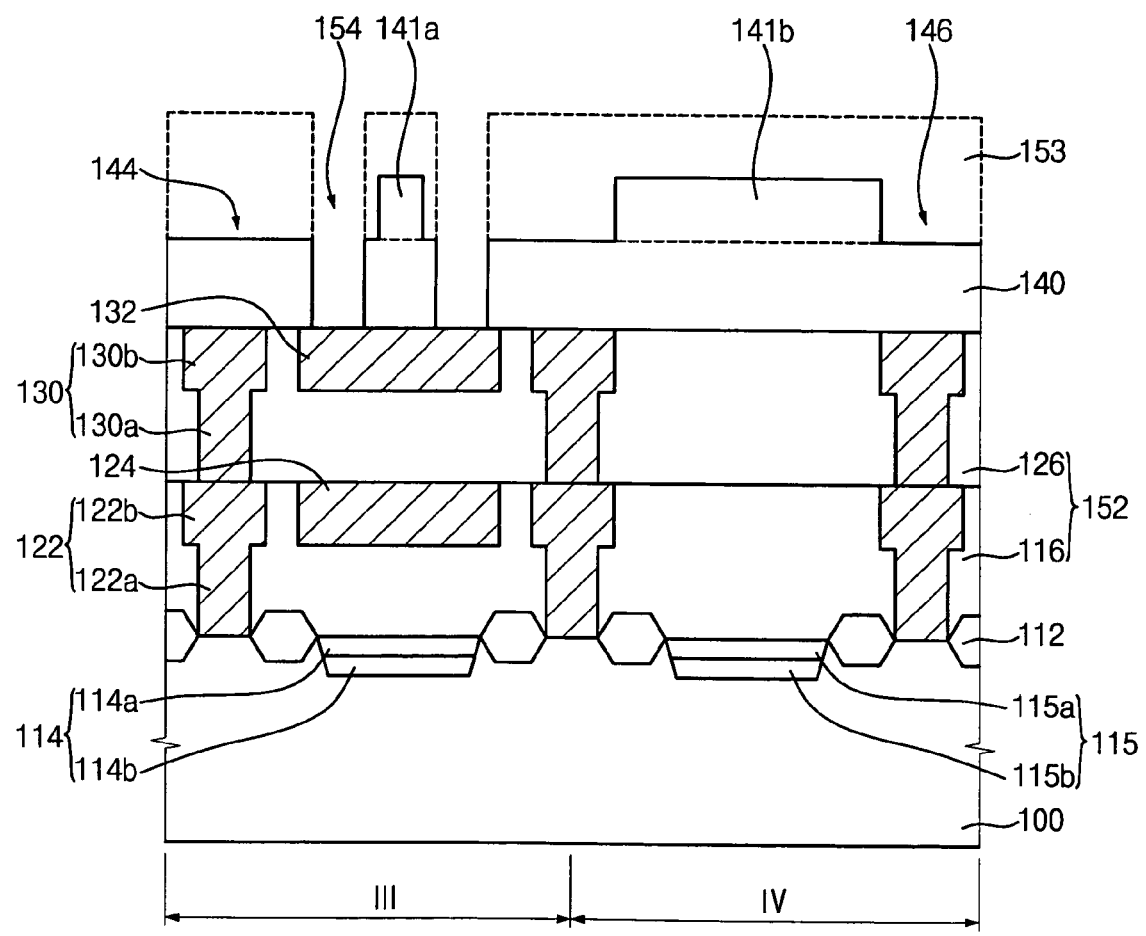

FIG. 10 is a cross-sectional view illustrating the formation of a via hole 154, upper light-shielding layer patterns 148, upper wiring 150 and light-shielding via pattern 158.

Referring to FIG. 10, fourth photoresist pattern 153 is formed on third insulating interlayer 140, dummy pattern 141a and fourth insulating interlayer 141b. Fourth photoresist pattern 153 typically exposes a pipe-shaped portion of third insulating interlayer 140 in the optical black area III. Dummy pattern 141a is buried in the exposed portion of third insulating interlayer 140.

Third insulating interlayer 140 is partially etched using fourth photoresist pattern 153 as an etching mask to thereby form via hole 154 partially exposing the second light-shielding layer pattern 132. Via hole 154 typically has a pipe shape enclosing dummy pattern 141a. Fourth photoresist pattern 153 is typically removed by an ashing process and/or a stripping process.

Referring to FIG. 3 and FIG. 10, a third conductive layer including copper is formed on third insulating interlayer 140, dummy pattern 141a and fourth insulating interlayer 141b to fill up via hole 154, first upper trench 144 and second upper trench 146.

The third conductive layer including copper is partially etched to form upper light-shielding layer patterns 148, upper wiring 150 and light-shielding via pattern 158 as shown in FIG. 3. The third conductive layer is typically partially removed by a CMP process, an etch-back process or a combination of a CMP process and an etch back process.

Light-shielding via pattern 158 is formed between second light-shielding layer pattern 132 and upper light-shielding layer pattern 148. Light-shielding via pattern 158 completely encloses a lower portion of dummy pattern 141a, and upper light-shielding layer pattern 148 encloses an upper portion of dummy pattern 141a. Accordingly, light passing through dummy pattern 141a is shielded by light-shielding via pattern 158 and second light-shielding layer pattern 132. As a result, the light does not reach first photodiode 114 in optical black area III, and therefore a malfunction of the image sensor does not occur due to a noisy reference signal.

By forming dummy pattern 141a is adjacent to first upper trench 144, upper light-shielding layer pattern 148 and upper wiring 150 are prevented from being dished while the third conductive layer is partially removed by the CMP process used to form upper light-shielding layer pattern 148.

Figure 11:
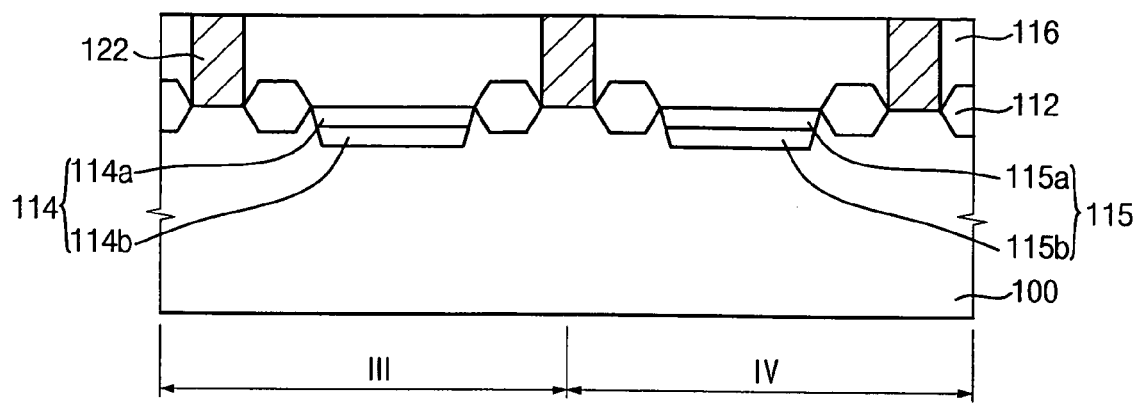
FIGS. 11 to 13 are cross-sectional views illustrating a method of manufacturing an image sensor in accordance with another embodiment of the invention.
Figure 12:
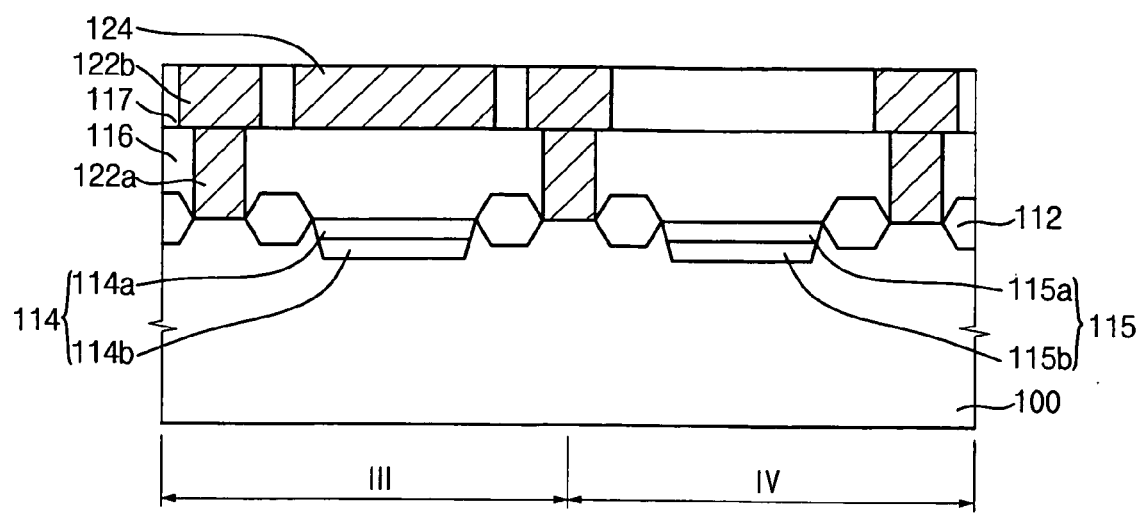
Figure 13:
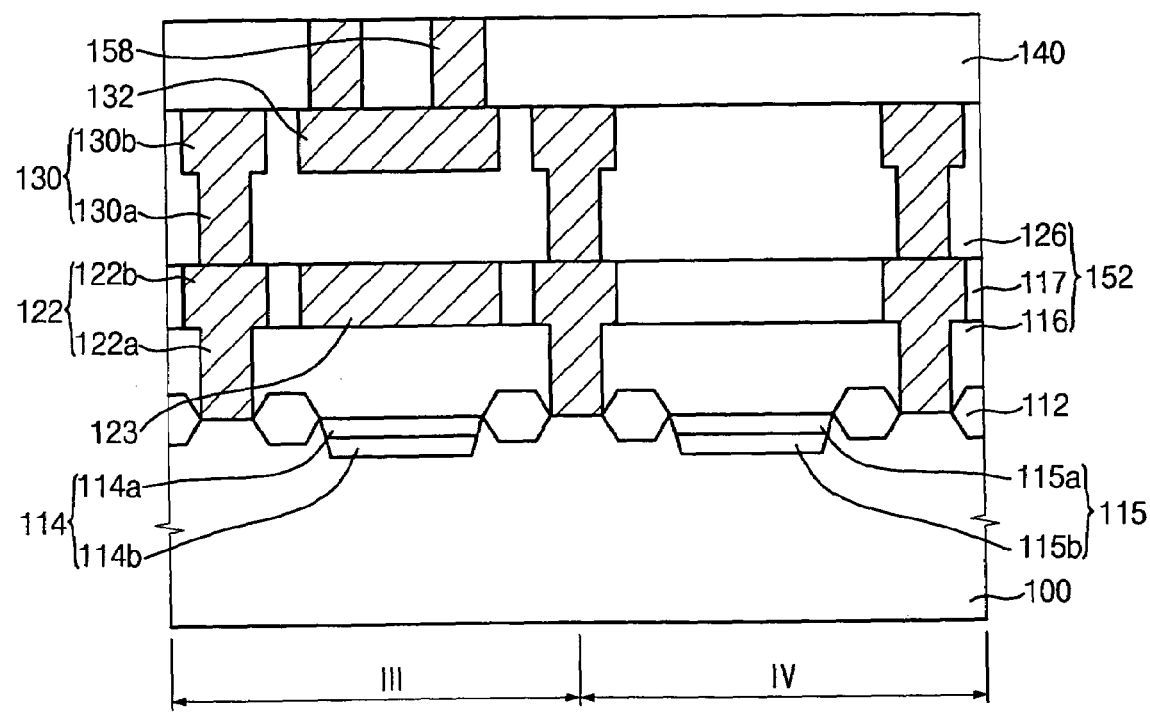

FIGS. 11 to 13 are cross-sectional views illustrating a method of manufacturing an image sensor in accordance with selected embodiments of the invention. The method illustrated in FIGS. 11 to 13 is substantially the same as that described with reference to FIGS. 4 to 10 except for a variation in insulating interlayer structure 152.

Referring to FIG. 11, isolation layer 112 is formed on substrate 100, and pixel sensors are formed in optical black area III and optical acceptance area IV The pixel sensor in optical black area III includes first photodiode 114 and four transistors (not shown), and the pixel sensor in the optical acceptance area IV has second photodiode 115 and four transistors (not shown).

First insulating interlayer 116 is formed on substrate 100 to cover first photodiode 114, second photodiode 115 and the four transistors. First insulating interlayer 160 is partially etched to form first contact holes (not shown) partially exposing substrate 100.

A first diffusion barrier layer (not shown) is formed on sidewalls of the first contact holes, exposed portions of the substrate 100 and first insulating interlayer 116. The first diffusion barrier layer prevents copper atoms included in first contacts 122a from diffusing into substrate 100 and/or first insulating interlayer 116.

After a first conductive layer including copper is formed on the first diffusion barrier layer to fill up the first contact holes, the first conductive layer is partially removed to thereby form first contacts 122a in the first contact holes, respectively.

Referring to FIG. 12, second insulating interlayer 117 is formed on first insulating interlayer 116 and first contacts 122a. Second insulating interlayer 117 is partially etched to form first trenches (not shown) for first subsidiary wirings 122b. The first trenches expose first contacts 122a. Each of the first trenches typically has a line shape. Additionally, a second trench (not shown) for first light-shielding layer pattern 124 is formed between the first trenches in optical black area III. The second trench is typically formed together with the first trenches.

A second diffusion barrier layer is formed on sidewalls of the first and the second trenches and on first insulating interlayer 116. The second diffusion barrier layer prevents copper atoms contained in first subsidiary wirings 122b and first light-shielding layer pattern 124 from diffusing into first insulating interlayer 116 and/or second insulating interlayer 117.

After a second conductive layer including copper is formed on the second diffusion layer, the second conductive layer is partially removed to form first subsidiary wirings 122b and first light-shielding layer pattern 124 in the first trenches and the second trench, respectively. Once first subsidiary wirings 122b are formed on first contacts 122a, first lower wirings 122 are formed in first and second insulating interlayers 116 and 117.

Third insulating interlayer 126 is then formed on second insulating interlayer 117, and first light-shielding layer pattern 124, first wirings 122, second wirings 130, and second light-shielding layer pattern 132 are formed using a third conductive layer including copper by processes substantially identical to those described with reference to FIG. 8. Each of second wirings 130 includes second contact 130a and second subsidiary wiring 130b.

Referring to FIG. 13, fourth insulating interlayer 140 is formed on third insulating interlayer 126, second light-shielding layer pattern 132 and second lower wirings 130.

Fourth insulating interlayer 140 is partially etched by a photolithography process to form a via hole (not shown) exposing second light-shielding layer pattern 132.

After a fourth conductive layer of copper is formed on fourth insulating interlayer 140 to fill up the via hole, the fourth conductive layer is partially removed so that light-shielding via pattern 158 is formed on second light-shielding layer pattern 132 through fourth insulating interlayer 140. Light-shielding via pattern 158 preferably has a pipe shape.

A dummy layer (not shown) is formed on fourth insulating interlayer 140 and light-shielding via pattern 158, and then the dummy layer is patterned to form a first upper trench and a second upper trench at upper portions of the dummy layer. The first upper trench is used to form an upper light-shielding layer pattern and the second upper trench is used to form an upper wiring.

In addition, a dummy pattern is formed adjacent to the first upper trench, and a fifth insulating interlayer is formed between the second upper trench and the first upper trench. The dummy pattern is positioned at a central portion of light-shielding via pattern 158. The first upper trenches partially expose light-shielding via pattern 158.

A fifth conductive layer including copper and filling up the first and second upper trenches is formed on fourth insulating interlayer 140, the fifth insulating interlayer and the dummy pattern. The fifth conductive layer is partially removed to form the upper light-shielding layer pattern and the upper wiring in the first upper trench and the second upper trench, respectively.

Figure 14:
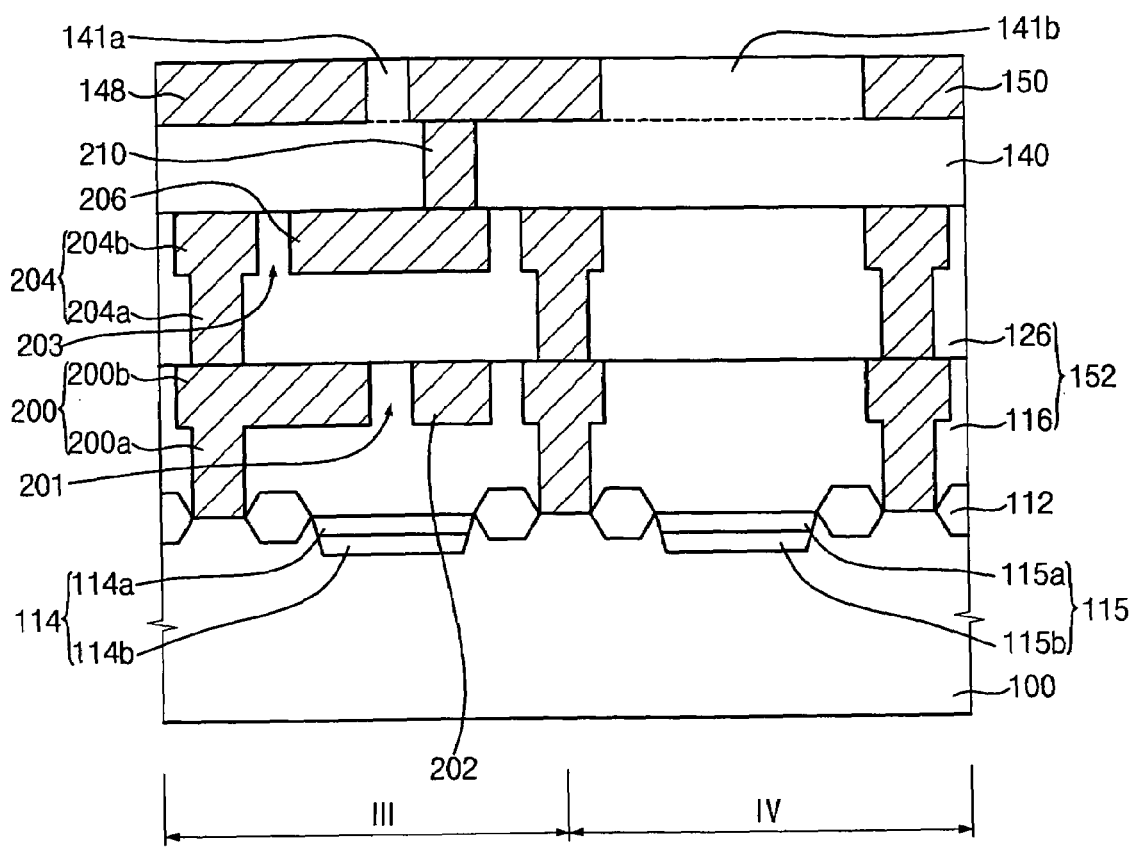
FIG. 14 is a cross-sectional view illustrating an image sensor in accordance with another embodiment of the invention.

FIG. 14 is a cross-sectional view illustrating an image sensor in accordance with one embodiment of the present invention.

Referring to FIG. 14, the image sensor includes a plurality of pixel sensors formed in optical black area III and optical acceptance area IV of substrate 100. Each of the pixel sensors has a substantially identical construction. For example, each of the pixel sensors includes one photodiode 114 or 115 and four transistors (not shown).

First photodiode 114 is formed in optical black area III and second photodiode 115 is formed in optical acceptance area IV. First photodiode 114 includes P-type impurity region 114a and N-type impurity region 114b. Second photodiode 115 includes P-type impurity region 115a and N-type impurity region 115b.

Insulating interlayer structure 152 is formed on substrate 100. Insulating interlayer structure 152 includes at least one insulating interlayer. For example, insulating interlayer structure 152 includes first insulating interlayer 116 and second insulating interlayer 126. Additional insulating interlayers such as third insulating interlayer 140 and fourth insulating interlayer 141b may also be formed on insulating interlayer structure 152 as shown in FIG. 14. As described above, first and second insulating interlayers 116 and 126 are referred to as lower insulating interlayers while the third and the fourth insulating interlayers may be referred to as upper insulating interlayers.

The image sensor further includes a metal structure comprising first wirings 200, second wirings 204, first lower light-shielding layer pattern 202, and second lower light-shielding layer pattern 206.

First wirings 200 are formed in optical black area III and optical acceptance area IV through first insulating interlayer 116. Each of first wirings 200 includes first contact 200a and first subsidiary wiring 200b. First contact 200a makes contact with a predetermined portion of substrate 100, and first subsidiary wiring 200b is located on first contact 200a. First subsidiary wiring 200b typically has a line shape. First wiring 200 in optical black area III preferably has a structure different from that of first wirings 200 in optical acceptance area IV.

First wirings 200 in optical acceptance area IV do not overlap with second photodiode 115. However, first wiring 200 in optical black area III may be overlapped, at least partially, by first photodiode 114. In other words, first subsidiary wiring 200b of first wiring 200 in optical black area III may extend horizontally over a portion of first insulating interlayer 116 over first photodiode 114 so that first wiring 200 is partially overlapped by first photodiode 114. Here, first subsidiary wiring 200b of first wiring 200 in optical black area III is longer than that of first wirings 200 in optical acceptance area IV.

First light-shielding layer pattern 202 is formed at an upper portion of first insulating interlayer 116 between first subsidiary wirings 200b. First light-shielding layer pattern 202 is positioned in optical black area III, and is separated from first wirings 200. First light-shielding layer pattern 202 is at least partially overlapped by first photodiode 114 so as to prevent light from reaching first photodiode 114.

First light-shielding layer pattern 202 and first subsidiary wirings 200b are spaced apart from substrate 100 by substantially identical distances. A first gap 201 (i.e., an upper portion of the first insulating interlayer 116) is interposed between first light-shielding layer pattern 202 and the first subsidiary wirings 200b.

Second wirings 204 are formed in optical black area III and optical acceptance area IV through second insulating interlayer 126. Each of second wirings 204 includes second contact 204a and second subsidiary wiring 204b. Second contact 204a makes contact with first subsidiary wiring 200b, and second subsidiary wiring 204b is located on second contact 204a. Second subsidiary wirings 204b are typically formed to have line shapes.

Second light-shielding layer pattern 206 is formed in second insulating interlayer 126 between second wirings 204 in optical black area III. Second light-shielding layer pattern 206 is formed at an upper portion of second insulating interlayer 126 between second subsidiary wirings 204b. Second light-shielding layer pattern 206 is at least partially overlapped by first photodiode 114 so that light is not irradiated onto first photodiode 114.

Second light-shielding layer pattern 206 and second subsidiary wiring 204b are separated from substrate 100 by substantially identical distances. A second gap 203 (i.e., an upper portion of second insulating interlayer 126) is formed between second light-shielding layer pattern 206 and second subsidiary wiring 204b. As shown in FIG. 14, second gap 203 is typically offset from first gap 201. Accordingly, light passing through second gap 203 may not directly reach first gap 201, and therefore the light will not be incident on first photodiode 114.

First light-shielding layer pattern 202 is preferably made of a material substantially identical to that of first wirings 200. In addition, second light-shielding layer pattern 206 typically includes a material substantially identical to that of second wirings 204. For example, first wirings 202, second wirings 204, first light-shielding layer pattern 202, and second light-shielding layer pattern 206 are all preferably formed of a material including copper.

Where first and second wirings 200 and 204 include copper, first and second subsidiary wirings 200b and 204b may have a small thickness because copper has low electrical resistance relative to other metals such as aluminum or tungsten. Although first subsidiary wiring 200b in optical black area III is longer than first subsidiary wiring 200b in optical acceptance area IV, relatively precise reference signals may be obtained from optical black area III and optical acceptance area IV because first subsidiary wiring 200b in optical black area III has electrical resistance substantially equal to that of first subsidiary wiring 200b in optical acceptance area IV.

Third insulating interlayer 140 is formed on second insulating interlayer 126, second wirings 204 and second light-shielding layer pattern 206.

At least one upper light-shielding layer pattern 148 is formed on third insulating interlayer 140 in the optical black area III. Upper light-shielding layer pattern 148 may include copper. Dummy pattern 141a is formed on third insulating interlayer 140. Dummy pattern 141a is enclosed by upper light-shielding layer pattern 148. Hence, first photodiode 114 in optical black area III may be completely covered with upper light-shielding layer pattern 148 and dummy pattern 141a.

At least one upper wiring 150 is disposed on third insulating interlayer 140 in optical acceptance area IV Upper wiring 150 may include copper. Upper wiring 150 may not be overlapped with second photodiode 115.

Light-shielding via pattern 210 is formed in a portion of third insulating interlayer 140 beneath upper light-shielding layer pattern 210. Light-shielding via pattern 210 is adjacent to dummy pattern 141a. Second light-shielding layer pattern 206 is connected to upper light-shielding layer pattern 148 through light-shielding via pattern 210. Light-shielding via pattern 210 blocks light passing through dummy pattern 141a from reaching first photodiode 114. Light incident at optical black area III is primarily blocked by light-shielding via pattern 210, upper light-shielding layer pattern 148 and second light-shielding layer pattern 206. Then, light passing through second gap 203 is secondarily blocked by first wiring 200 and first light-shielding layer pattern 202. As a result, the light does not reach first photodiode 114 in optical black area III so that a precise reference signal is obtained by the pixel sensor in optical black area III.

FIGS. 15, 16, 18 and 19 are cross-sectional views illustrating a method of manufacturing an image sensor in accordance with various embodiments of the invention. FIG. 17 is a planar view illustrating the method of manufacturing the image sensor shown in FIG. 16. FIG. 20 is a planar view illustrating the method of manufacturing the image sensor shown in FIG. 19.

Figure 15:
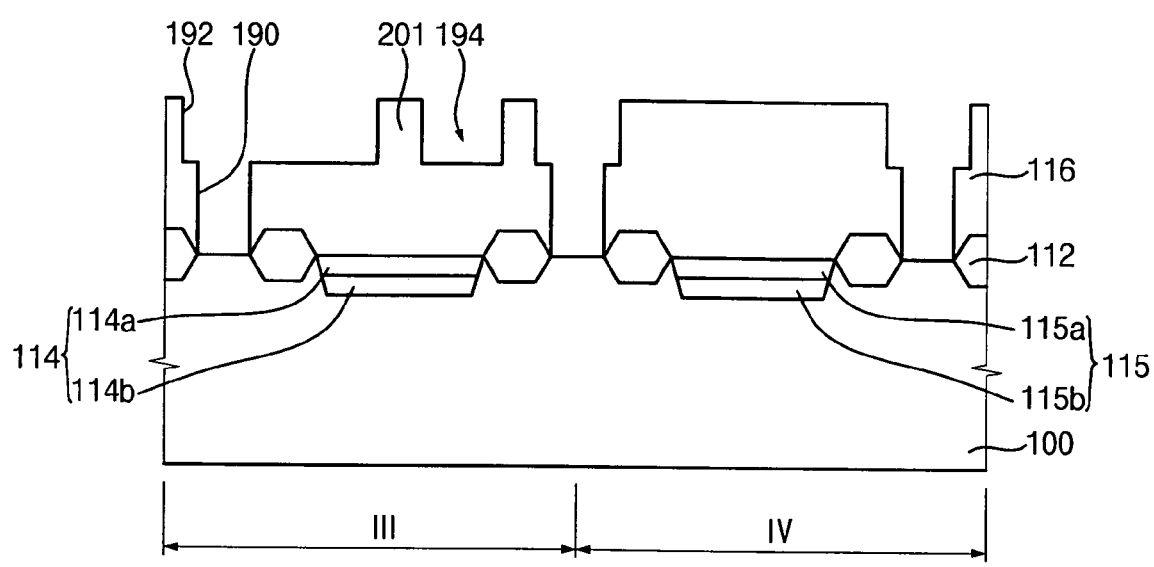
FIGS. 15, 16, 18 and 19 are cross-sectional views illustrating a method of manufacturing an image sensor in accordance with another embodiment of the invention.

FIG. 15 is a cross-sectional view illustrating the formation of isolation layer 112, first photodiode 114, second photodiode 115, first contact holes 190, first trenches 192 and a second trench 194.

Referring to FIG. 15, pixel sensors are formed on semiconductor substrate 100. Each of the pixel sensors typically includes a photodiode and four transistors as described above. Isolation layer 112 is formed on substrate 100 to define active regions and field regions on substrate 100.

First photodiode 114 is formed in optical black area III, and second photodiode 115 is formed in optical acceptance area IV First photodiode 114 includes P-type impurity region 114a and N-type impurity region 114b. Second photodiode 115 includes P-type impurity region 115a and N-type impurity region 115b.

First insulating interlayer 116 is formed on substrate 100 to over first and second photodiodes 114 and 115, isolation layer 112, and the four transistors. First insulating interlayer 116 is typically formed using a transparent insulation material such as an oxide containing silicon.

A first photoresist pattern (not shown) is formed on first insulating interlayer 116. First insulating interlayer 116 is selectively etched using the first photoresist pattern as an etching mask to form first trenches 192 and second trench 194 at upper portions of first insulating interlayer 116. Second trench 194 is positioned in optical black area III only. First and second trenches 192 and 194 are used to form first subsidiary wirings 200b (see FIG. 16) and first light-shielding layer pattern 202 (see FIG. 16), respectively. Second trench 194 is at least partially overlapped by first photodiode 114 in optical black area III.

First trench 192 in optical black area III is located close to second trench 194 to reduce first gap 201 between first trench 192 and second trench 194 in optical black area III. First trench 192 in optical black area III extends over first photodiode 114. Accordingly, first trench 192 in optical black area III is substantially wider than first trenches 192 in optical acceptance area IV After the first photoresist pattern is removed by an ashing process and/or a stripping process, a second photoresist pattern (not shown) is formed on first insulating interlayer 116. Here, the second photoresist pattern does not expose a portion of first insulating interlayer 116 under which second photodiode 115 is positioned in optical acceptance area IV.

Using the second photoresist pattern as an etching mask, first contact holes 190 are formed in first insulating interlayer 116 by etching portions of first insulating interlayer 116 exposed through first lower trenches 192. First contact holes 190 are respectively connected to first trenches 192.

First contact holes 190 expose predetermined portions of substrate 100. The second photoresist pattern is removed by an ashing process and/or a stripping process.

First trenches 192 and second trench 194 are generally formed at the upper portions of first insulating interlayer 116 after first contact holes 190 are formed through first insulating interlayer 116.

Figure 16:
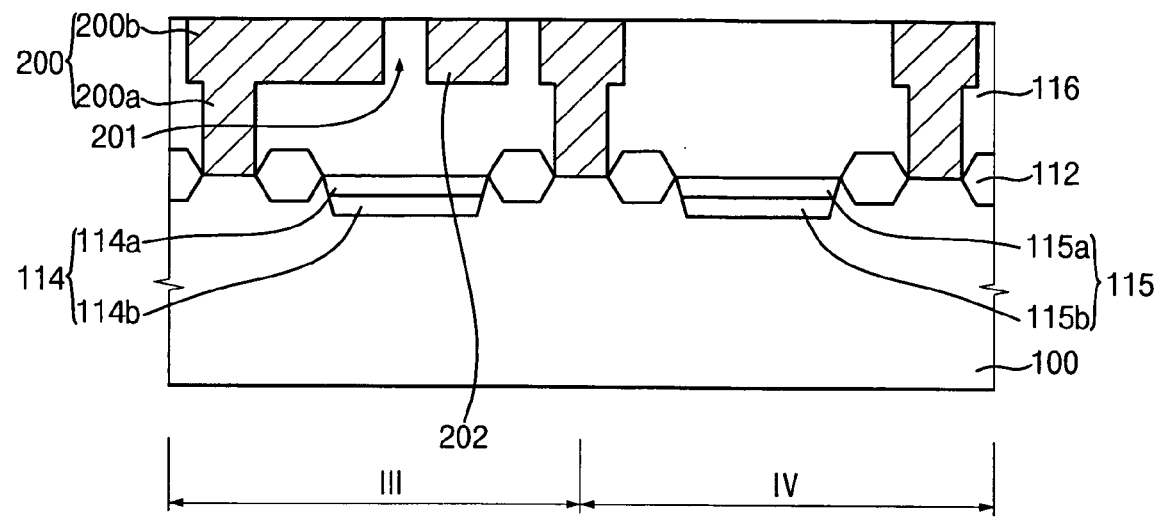
Figure 17:
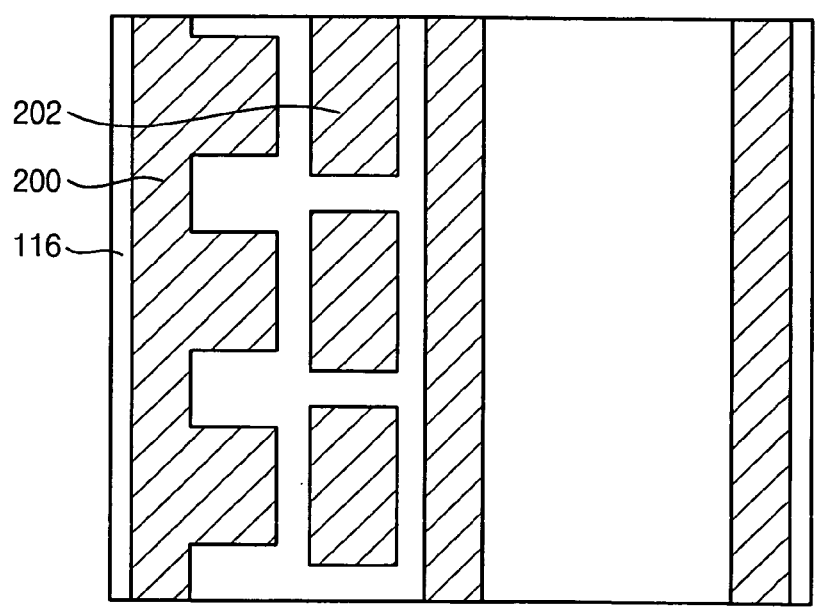
FIG. 17 is a planar view illustrating the method of manufacturing the image sensor shown in FIG. 16.

FIG. 16 is a cross-sectional view illustrating the formation of first lower wirings 200 and first light-shielding layer pattern 202. FIG. 17 is a planar view illustrating first lower wirings 200 and first light-shielding layer pattern 202 in FIG. 16.

Referring to FIGS. 16 and 17, a first diffusion barrier layer (not shown) is formed on first insulating interlayer 116, on exposed portions of substrate 100, on sidewalls of first contact holes 190, on sidewalls of first trenches 192, and on a sidewall of second trench 194. The first diffusion barrier layer inhibits copper atoms in first lower wirings 200 and first light-shielding layer pattern 202 from diffusing into first insulating interlayer 116 and substrate 100.

A first conductive layer (not shown) including copper is formed on first insulating interlayer 116 to fill up first contact holes 190, first trenches 192 and second trench 194. The first conductive layer is typically formed by an electrolytic plating process or an electroless plating process.

The first conductive layer is partially removed to form first lower wirings 200 and first light-shielding layer pattern 202. First lower wirings 200 include first contacts 200a formed in first contact holes 190, and first subsidiary wirings 200b formed in first trenches 192. First light-shielding layer pattern 202 is formed in second trench 194. First lower wirings 200 and first light-shielding layer pattern 202 are typically formed by a CMP process, an etch-back process or a combination of a CMP process and an etch-back process.

As shown in FIGS. 16 and 17, first subsidiary wiring 200b in optical black area III has a shape substantially different from those of first subsidiary wirings 200b in optical acceptance area IV. In particular, first subsidiary wiring 200b in optical black area III is wider than first subsidiary wiring 200b in optical acceptance area IV because first subsidiary wiring 200b in optical black area II extends over first photodiode 114.

Figure 18:
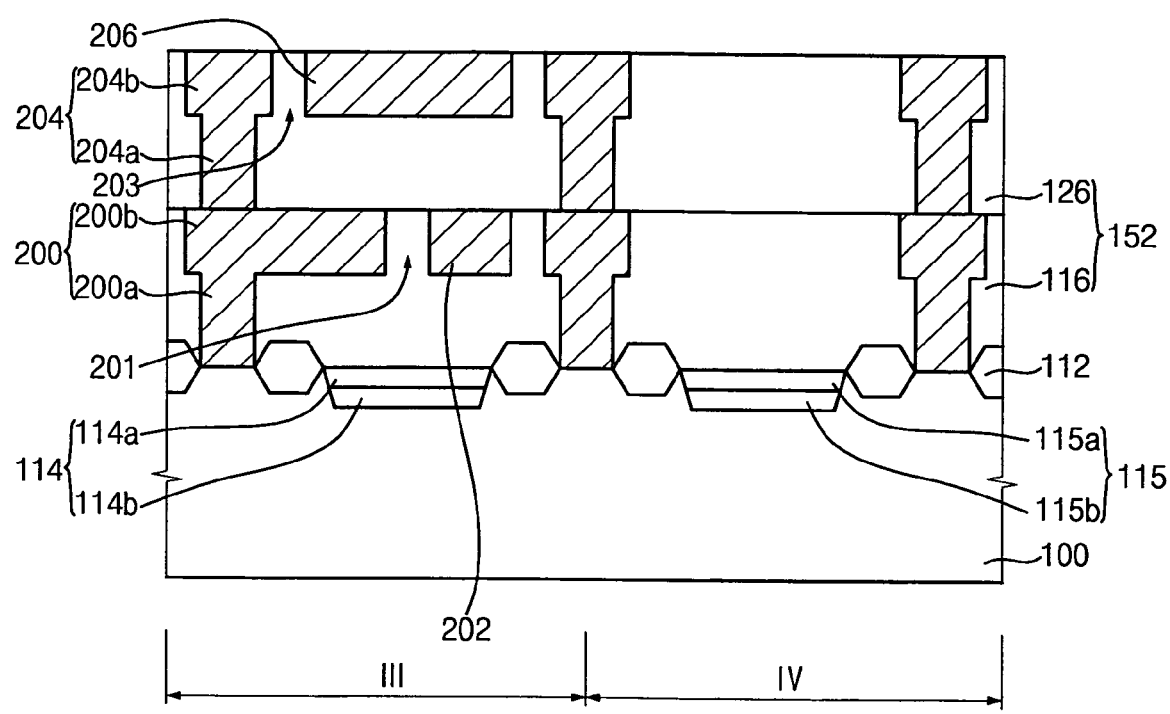

FIG. 18 is a cross-sectional view illustrating the formation of second lower wirings 204 and a second light-shielding layer pattern 206.

Referring to FIG. 18, second insulating interlayer 126 is formed on first insulating interlayer 116, first lower wirings 200 and first light-shielding layer pattern 202. Second insulating interlayer 126 is preferably formed using a transparent insulation material such as an oxide containing silicon.

A third photoresist pattern (not shown) is formed on second insulating interlayer 126. The third photoresist pattern exposes portions of second insulating interlayer 126 where second wirings 204 and second light-shielding layer pattern 206 are formed.

Exposed portions of second insulating interlayer 126 are etched using the third photoresist pattern as an etching mask to form third trenches (not shown) and a fourth trench at upper portions of second insulating interlayer 126. The fourth trench is positioned in optical black area III only, and is at least partially overlapped by first photodiode 114.

Second gap 203 between third and fourth trenches is preferably minimized in the etching process used to form the third and the fourth trenches. Second gap 203 is preferably offset from first gap 201. For instance, first and second gaps 201 and 203 may be alternately formed by varying dimensions and/or shape of the fourth trench in optical black area III.

The third photoresist pattern is removed by an ashing process and/or a stripping process, and then a fourth photoresist pattern (not shown) is formed on second insulating interlayer 126. Using the fourth photoresist pattern as an etching mask, portions of second insulating interlayer 126 exposed by the third trenches are etched to thereby form second contact holes (not shown) exposing first lower wirings 200.

After the fourth photoresist pattern is removed by an ashing process and/or a stripping process, a second diffusion barrier layer (not shown) is formed on second insulating interlayer 126, on exposed first lower wirings 200, on sidewalls of the second contact holes, on sidewalls of the third trenches, and on a sidewall of the fourth trench. The second diffusion barrier layer inhibits copper atoms in second lower wirings 204 and second light-shielding layer pattern 206 from diffusing into second insulating interlayer 126 and first lower insulating interlayer 116.

A second conductive layer (not shown) including copper is formed on second insulating interlayer 126 to fill up the second contact holes, the third trenches and the fourth trench. The second conductive layer is typically formed by an electrolytic plating process or an electroless plating process.

The second conductive layer is partially removed until second insulating interlayer 126 is exposed so that second lower wirings 204 and second light-shielding layer pattern 206 are formed in the third trenches and the fourth trench, respectively. The second conductive layer is typically partially etched by a CMP process, an etch-back process or a combination of a CMP process and an etch-back process. Second lower wirings 204 include second contacts 204a filling up the second contact holes, and second subsidiary wirings 204b filling up the third trenches. Since the fourth trench is positioned in optical black area III, second light-shielding layer pattern 206 is formed in optical black area III only. Once second wirings 204 are formed in second insulating interlayer 126, a metal structure comprising first wirings 200, second wirings 204, first lower light-shielding layer pattern 202, and second light-shielding layer pattern 206 is completed.

Figure 19:
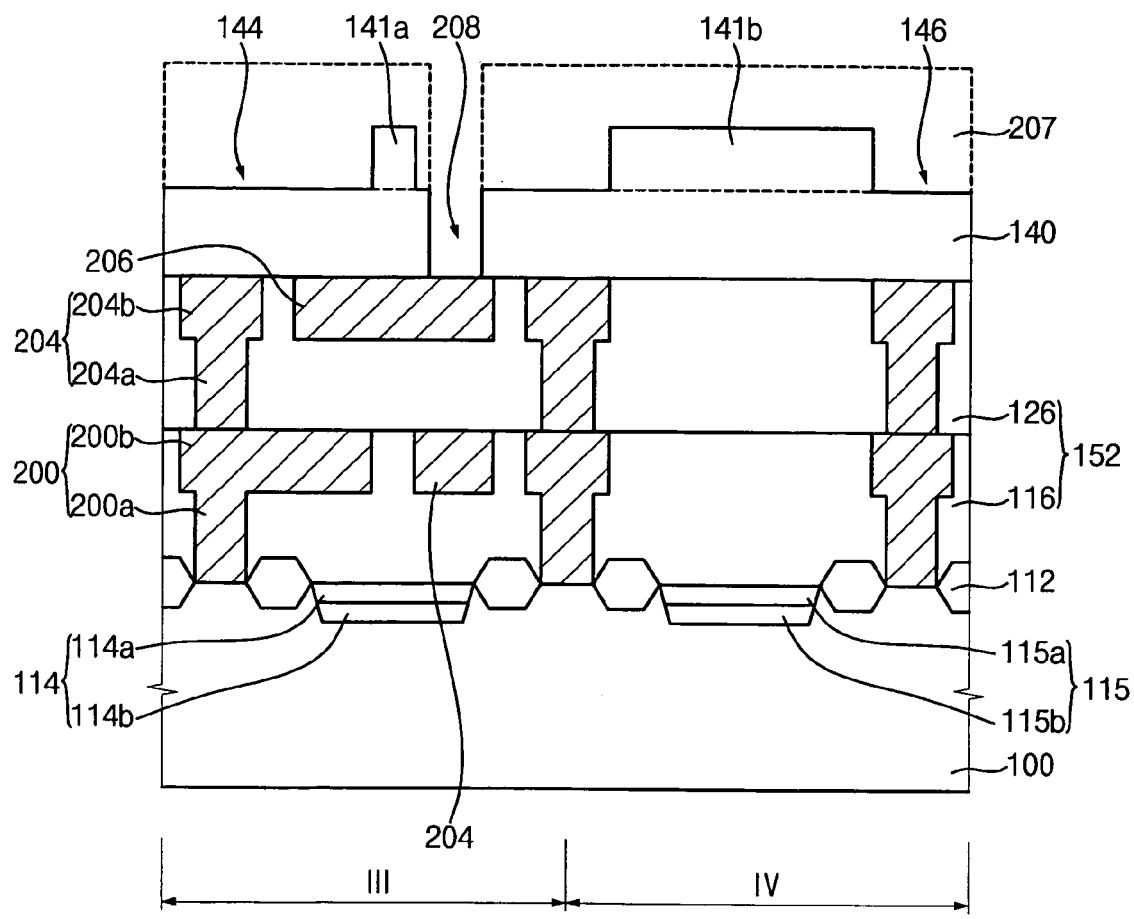
Figure 20:
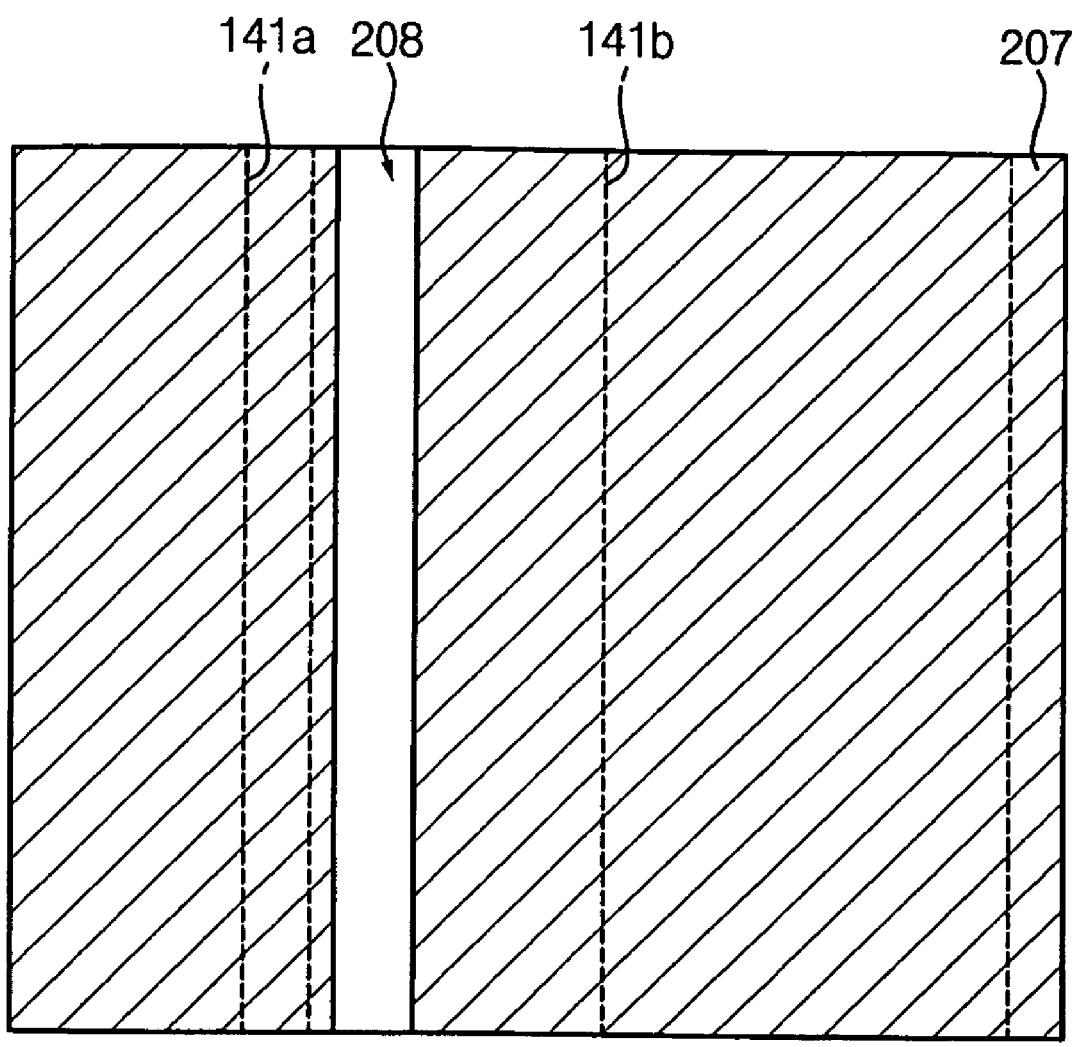
FIG. 20 is a planar view illustrating the method of manufacturing the image sensor in FIG. 19.

FIG. 19 is a cross-sectional view illustrating the formation of third insulating interlayer 140, dummy pattern 141a, fourth insulating interlayer 141b, first upper trench 144, and second upper trench 146. FIG. 20 is a planar view illustrating dummy pattern 141a and fourth insulating interlayer 141b in FIG. 19.

Referring to FIGS. 19 and 20, a preliminary upper insulating interlayer (not shown) is formed on second insulating interlayer 126, second lower wirings 204 and second light-shielding layer pattern 206. The preliminary upper insulating interlayer is preferably formed using a transparent insulation material such as an oxide containing silicon.

The preliminary upper insulating interlayer is partially etched by a photolithography process to form first upper trench 144 and second upper trench 146. First and second upper trenches 144 and 146 are formed at upper portions of the preliminary upper insulating interlayer. Hence, second insulating interlayer 126 is not exposed when first and second upper trenches 144 and 146 are formed. A lower portion of the preliminary insulating interlayer becomes third insulating interlayer 140.

In addition, when the preliminary upper insulating interlayer is partially removed, dummy pattern 141a and fourth insulating interlayer 141b are formed. Dummy pattern 141a is formed in optical black area III and fourth insulating interlayer 141b is formed in optical acceptance area IV. Dummy pattern 141a is typically overlapped, at least partially, by second light-shielding layer pattern 206.

Fifth photoresist pattern 207 is formed on third insulating interlayer 140, dummy pattern 141a, and fourth insulating interlayer 141b. Fifth photoresist pattern 207 exposes a portion of third insulating interlayer 140 adjacent to dummy pattern 141a. Preferably, the exposed portion of third insulating interlayer 140 has a line shape as shown in FIG. 20 so that light-shielding via pattern 210 (see FIG. 14) also has a line shape. Light-shielding via pattern 210 replaces the exposed portion of third insulating interlayer 140. Where light-shielding via pattern 210 has the line shape, light-shielding via pattern 210 may be formed more easily than a light-shielding via pattern having a pipe shape. Alternatively, the exposed portion of third insulating interlayer 140 may have a curved shape or a U-shape so that light-shielding via pattern 210 may also have a curved shape and a U-shape.

The exposed portion of third insulating interlayer 140 is etched using fifth photoresist pattern 207 as an etching mask to form via hole 208 partially exposing second light-shielding layer pattern 206. Fifth photoresist pattern 207 is removed by an ashing process and a stripping process.

Referring now to FIGS. 14 and 19, a third conductive layer (not shown) including copper is formed on third insulating interlayer 140 and fourth insulating interlayer 141b to fill up first upper trench 144, second upper trench 147, and via hole 208.

The third conductive layer including copper is partially removed until fourth insulating interlayer 141b is exposed. As a result, upper light-shielding layer pattern 148, upper wiring 150 and light-shielding via pattern 210 are formed. Upper light-shielding layer pattern 148 is formed in first upper trench 144, and upper wiring 150 is formed in second upper trench 146. Light-shielding via pattern 210 filling via hole 208 is formed between second light-shielding layer pattern 206 and upper light-shielding layer pattern 148.

Figure 21:
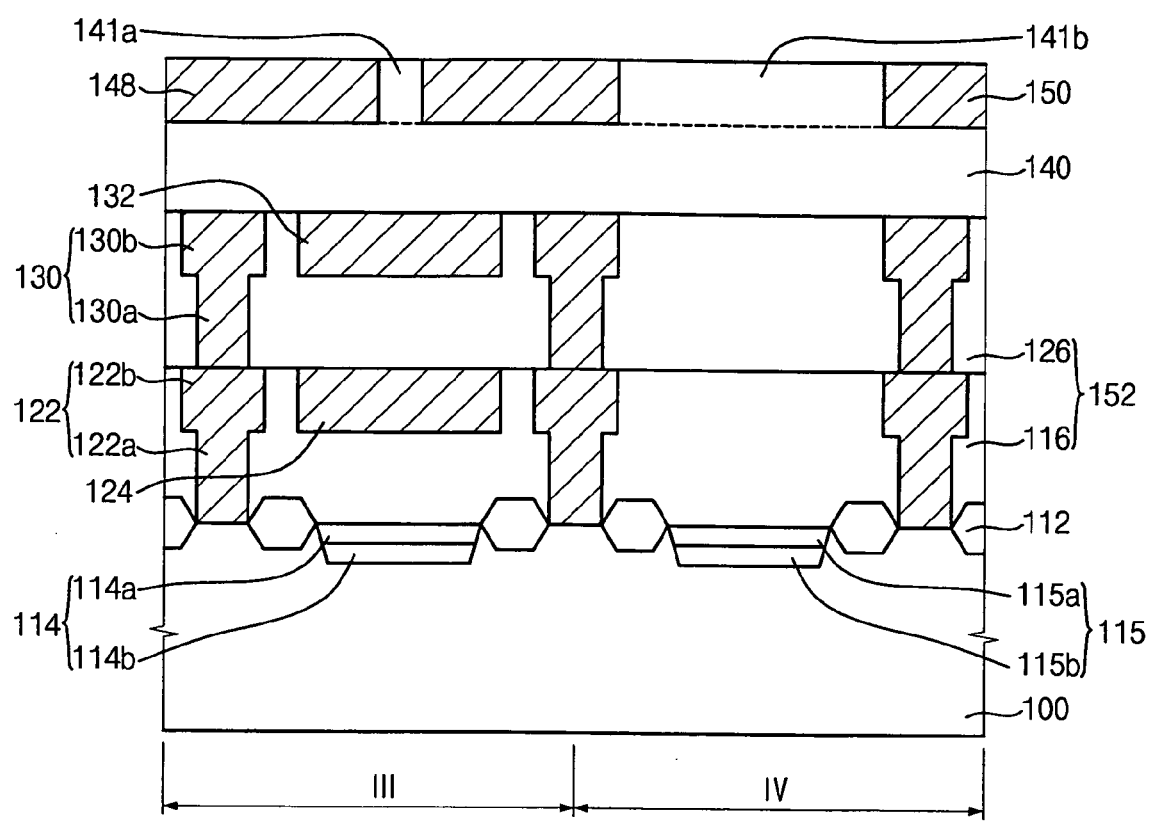
FIG. 21 is a cross-sectional view illustrating an image sensor in accordance with yet another embodiment of the present invention.

FIG. 21 is a cross-sectional view illustrating an image sensor in accordance with an embodiment of the present invention.

Referring to FIG. 21, the image sensor has a construction substantially identical to that of the image sensor described with reference to FIG. 3. However, the image sensor shown in FIG. 21 does not include light-shielding via pattern 158. The image sensor of FIG. 21 may be manufactured by processes substantially identical to those described with reference to FIGS. 4 to 9. However, it is not necessary to form via hole 154 since the image sensor of FIG. 21 does not include light-shielding via pattern 158.

Figure 22:
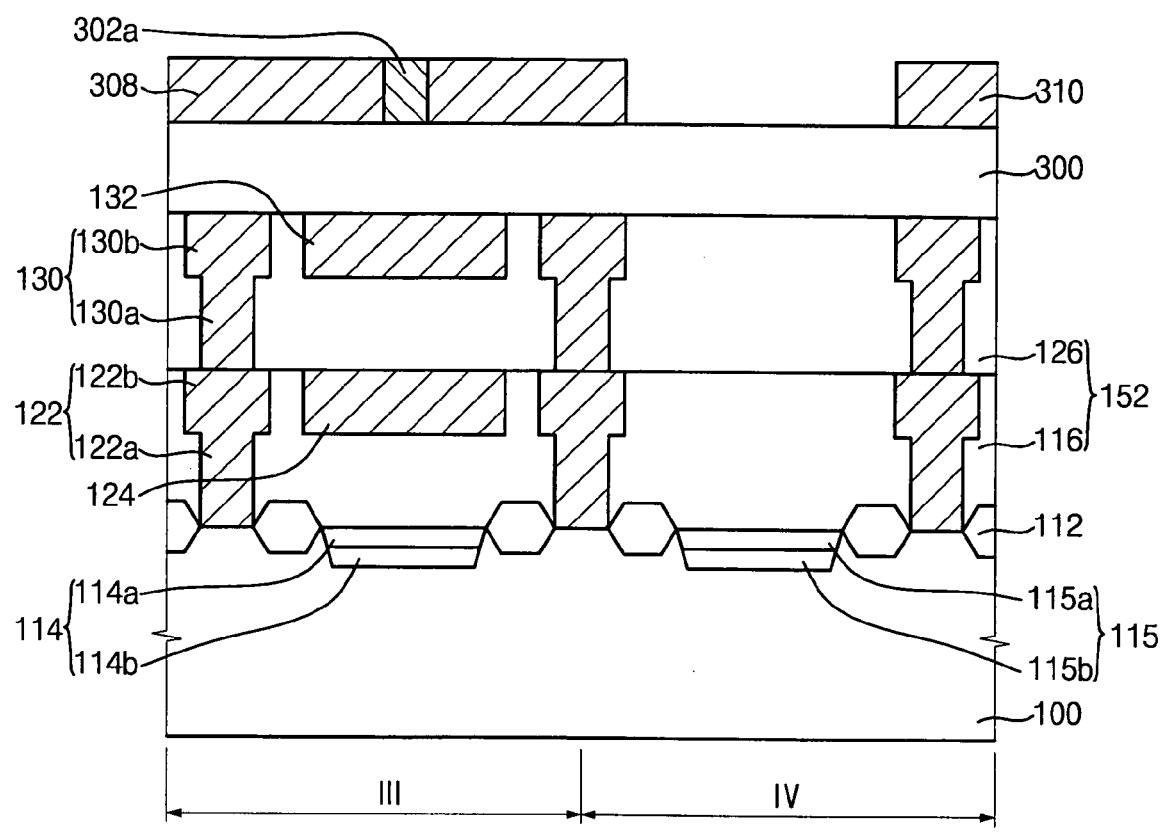
FIG. 22 is a cross-sectional view illustrating an image sensor in accordance with an still another embodiment of the present invention; and, FIGS. 23 through 25 are cross-sectional views illustrating a method of manufacturing an image sensor in accordance with still another embodiment of the present invention.

FIG. 22 is a cross-sectional view illustrating an image sensor in accordance with another embodiment of the present invention.

Referring to FIG. 22, the image sensor includes insulating interlayer structure 152 and a metal structure formed on substrate 100. In addition to first insulating interlayer 116 and second insulating interlayer 126, insulating interlayer structure 152 also has a third insulating interlayer 300 formed on substrate 100. Each of the first through third insulating interlayers 116, 126 and 300 preferably includes a transparent insulation material such as an oxide containing silicon.

The metal structure comprises first lower wirings 122 and second lower wirings 130. First lower wirings 122 are formed in first insulating interlayer 116, and second lower wirings 130 are formed in second insulating interlayer 126. Each of first lower wirings 122 comprises first contact 122a making contact with a predetermined portion of the substrate 100, and first lower wiring 122b formed on first contact 122a. Each of second lower wirings 130 comprises second contact 130a making contact with first lower wiring 122b, and second lower wiring 130b formed on second contact 130a.

The image sensor further includes first light-shielding layer pattern 124 buried in first insulating interlayer 116, and second light-shielding layer pattern 132 buried in second insulating interlayer 126. First and second light-shielding layer patterns 124 and 132 are formed in optical black area III.

Third insulating interlayer 300 is formed on second insulating interlayer 126, second lower wirings 130 and second light-shielding layer pattern 132.

Upper light-shielding layer pattern 308 is provided on third insulating interlayer 300 in optical black area III. Upper wiring 310 is formed on third insulating interlayer 300 in optical acceptance area IV. Upper light-shielding layer 308 and upper wiring 310 typically include copper.

Dummy pattern 302a is formed on third insulating interlayer 300 in optical black area III. Dummy pattern 302a is typically enclosed by upper light-shielding layer pattern 308. Dummy pattern 302a is preferably formed of a material having a light permeability substantially lower than that of third insulating interlayer 300. For example, dummy pattern 302a may be formed using a nitride containing silicon. Where dummy pattern 302a includes a material having a relatively low light permeability, light passing through dummy pattern 302a is blocked. Because dummy pattern 302a or the like is not formed on third insulating interlayer 300 in optical acceptance area IV, light is permitted to reach second photodiode 115.

Figure 23:
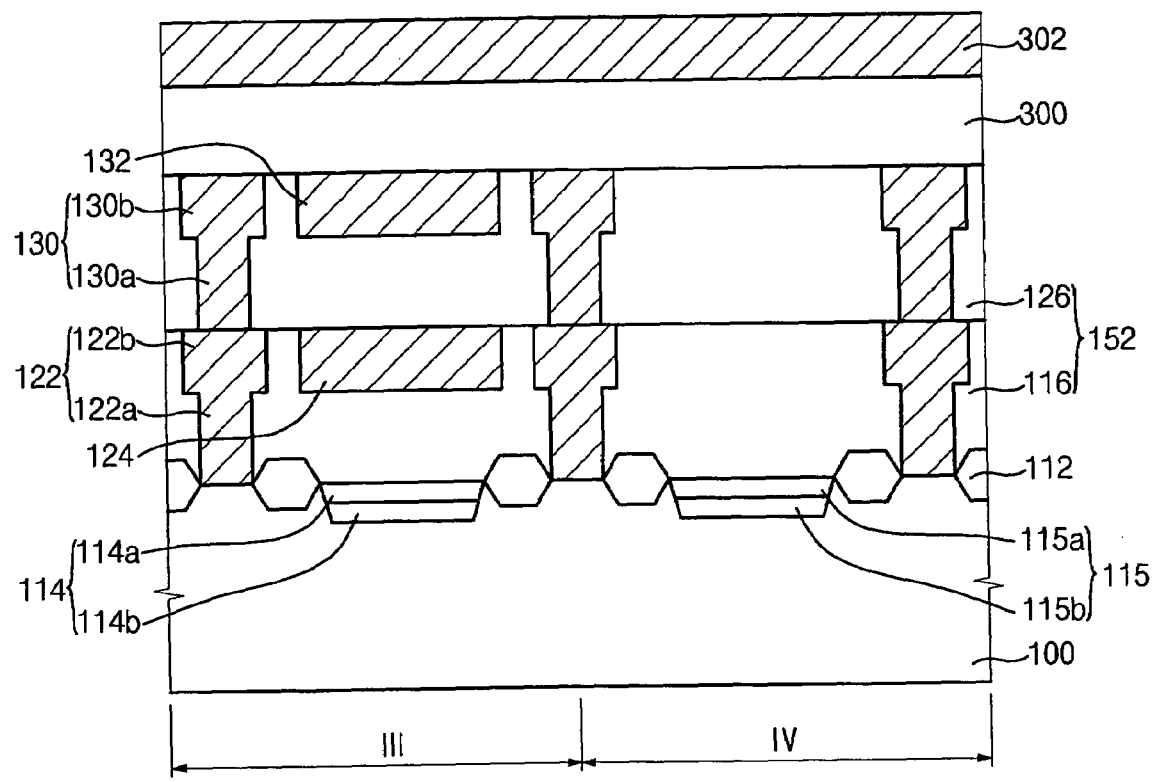
Figure 24:
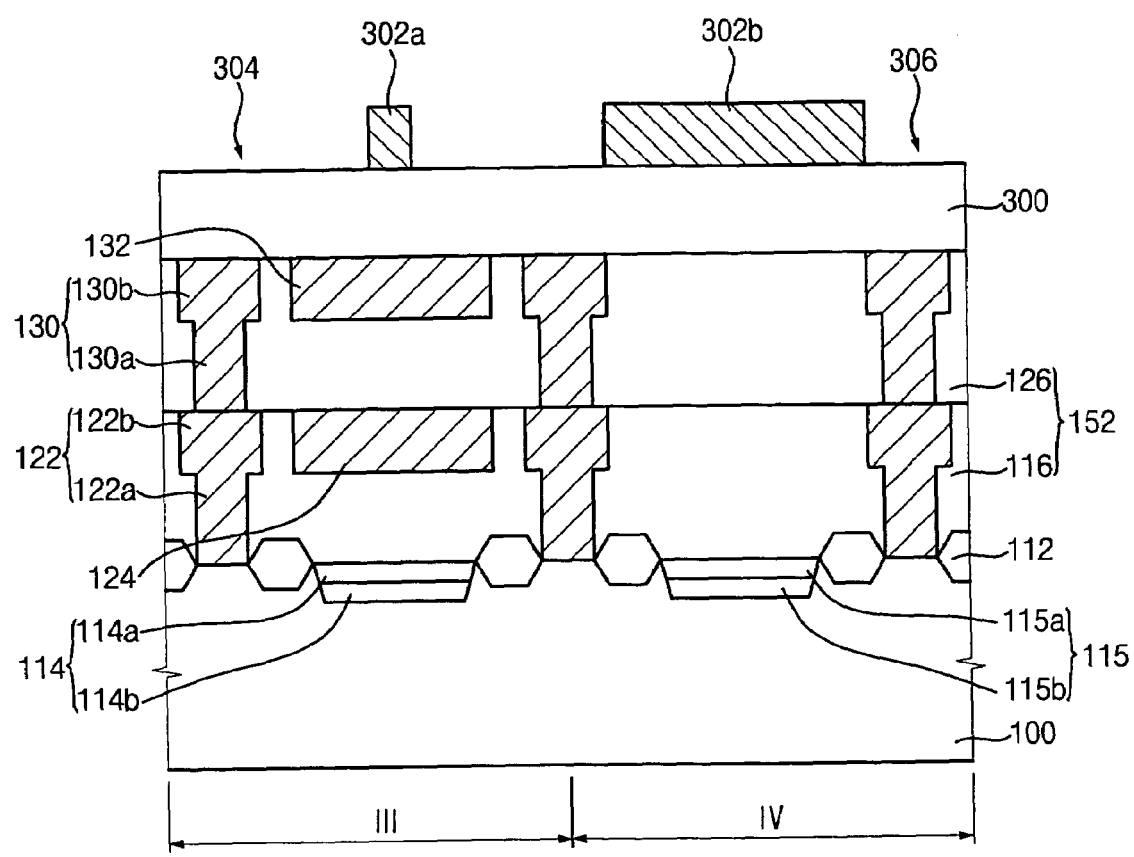
Figure 25:
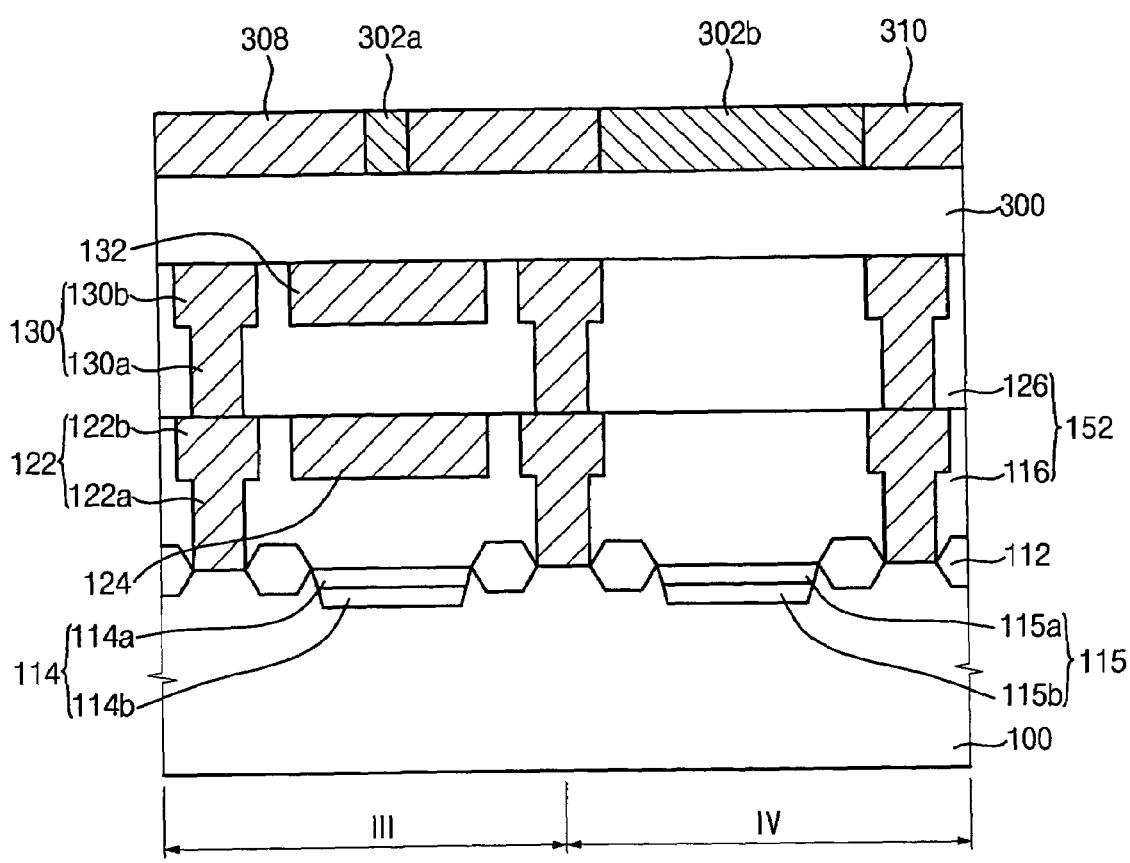

FIGS. 23 through 25 are cross-sectional views illustrating a method of manufacturing an image sensor in accordance with yet another embodiment of the present invention.

Referring to FIG. 23, insulating interlayer structure 152 having first and second insulating interlayers 116 and 126, a metal structure, first lower light-shielding layer pattern 124, and second lower light-shielding layer pattern 132 are formed on substrate 100 by processes substantially identical to those described with reference to FIGS. 4 to 8. The metal structure has first lower wirings 122 and second lower wirings 130 as described above.

Third insulating interlayer 300 of insulating interlayer structure 152 is formed on second insulating interlayer 126, second lower wirings 130 and second light-shielding layer pattern 132. Third insulation layer 300 is preferably formed using a transparent insulation material such as an oxide containing silicon.

Dummy layer 302 is formed on third insulating interlayer 300. Dummy layer 302 preferably has a lower permeability to light than third insulating interlayer 300. Preferably, dummy layer 302 is formed using a nitride containing silicon. Dummy layer 302 is patterned to form dummy pattern 302a and subsidiary dummy pattern 302b on third insulating interlayer 300.

Referring to FIG. 24, dummy layer 302 is partially etched to form first upper trench 304 in optical black area III and to form second upper trench 306 in optical acceptance area IV. Simultaneously, dummy pattern 302a and subsidiary dummy pattern 302b are formed on third insulating interlayer 300. Dummy pattern 302a is positioned in optical black area III, and subsidiary dummy pattern 302b is formed in optical acceptance area IV. Dummy pattern 302a and subsidiary dummy pattern 302b prevent an upper light-shielding layer pattern 308 and an upper wiring 310 from dishing when a third conductive layer is partially removed.

Referring to FIG. 25, the third conductive layer including copper is formed on dummy pattern 302a and subsidiary dummy pattern 302b to fill first upper trench 304 and second upper trench 306.

The third conductive layer is partially removed until dummy pattern 302a and subsidiary dummy pattern 302b are exposed, thereby forming upper light-shielding layer pattern 308 and upper wiring 310 in first upper trench 304 and second upper trench 306, respectively.

As shown in FIG. 22, the image sensor is completed when subsidiary dummy pattern 302b is removed from third insulating interlayer 300 in optical acceptance area IV.

By blocking light in the optical black area of image sensors as described above, the image sensors are able to produce more reliable reference signals. Accordingly, the image sensors avoid producing image distortion due to noisy reference signals.

The foregoing preferred embodiments are teaching examples. Those of ordinary skill in the art will understand that various changes in form and details may be made to the exemplary embodiments without departing from the scope of the present invention which is defined by the following claims.

What is claimed is:

1. An image sensor, comprising:
a photodiode formed in a substrate;
an insulating interlayer structure formed on the substrate;
a metal structure formed in the insulating interlayer structure, the metal structure comprises first wirings and second wirings,
each first wiring having a first contact making contact with the substrate and a first subsidiary wiring formed on the first contact, and
each second wirings having a second contact making contact with a first subsidiary wiring and a second subsidiary wiring formed on the second contact;
a dummy pattern at least partially overlapping the metal structure and formed on the insulating interlayer structure; and,
an upper light-shielding layer pattern at least partially overlapped by the photodiode and enclosing the dummy pattern.

2. The image sensor of claim 1, wherein a first gap between the first wirings is offset from a second gap between the second wirings.

3. The image sensor of claim 1, wherein the light-shielding layer pattern is formed by a damascene process.

4. The image sensor of claim 1, wherein the metal structure further comprises:
at least one lower light-shielding layer pattern electrically insulated from the first and second wirings.

5. The image sensor of claim 4, further comprising:
a light-shielding via pattern connecting the lower light-shielding layer pattern to the upper light-shielding layer pattern so as to block light passing through the dummy pattern.

6. The image sensor of claim 5, wherein the light-shielding via pattern has a pipe shape and the dummy pattern is disposed in the light-shielding via pattern.

7. The image sensor of claim 5, wherein the light-shielding via pattern is adjacent to a lower portion of the dummy pattern, and the light-shielding via pattern has a line shape, a curved shape or a U-shape.

8. An image sensor, comprising:
a first photodiode formed in an optical black area of a substrate;
a second photodiode formed in an optical acceptance area of the substrate;
an insulating interlayer structure formed on the substrate;
a plurality of wirings formed in the insulating interlayer structure;
a plurality of lower light-shielding layer patterns at least partially overlapped by the first photodiode and electrically insulated from the wirings, formed in the insulating interlayer structure;
at least one dummy pattern overlapping the lower light-shielding patterns and formed on the insulating interlayer structure; and,
an upper light-shielding layer pattern at least partially overlapped by the first photodiode and enclosing the dummy pattern.

9. The image sensor of claim 8, wherein the upper light-shielding layer pattern is formed by a damascene process.

10. The image sensor of claim 8, wherein the upper light-shielding layer pattern is formed of a material comprising copper.

11. The image sensor of claim 8, wherein the dummy pattern is formed of a material comprising an oxide or nitride containing silicon.

12. The image sensor of claim 8, wherein a plurality of dummy patterns are formed throughout the insulating interlayer structure.

13. The image sensor of claim 8, wherein the lower light-shielding layer patterns and the wirings are formed of substantially the same material.

14. The image sensor of claim 8, wherein the lower light-shielding layer patterns comprise:
a first lower light-shielding layer pattern; and,
a second lower light-shielding layer pattern; and,
wherein the wirings comprise;
contacts making contact with the substrate, and subsidiary wirings formed on the contacts.

15. The image sensor of claim 8, further comprising:
a light-shielding via pattern connecting the upper light-shielding layer pattern to the lower light-shielding layer patterns so as to at least partially block light passing through the dummy pattern.

16. The image sensor of claim 15, wherein the light-shielding via pattern has a pipe shape and the dummy pattern is formed in the light-shielding via pattern.

17. The image sensor of claim 15, wherein the light-shielding via pattern is adjacent to a lower portion of the dummy pattern, and the light-shielding via pattern has a line shape, a curved shape or a U-shape.

18. A method of manufacturing an image sensor, the method comprising:
forming a photodiode in a substrate;
forming an insulating interlayer structure comprising at least one insulating interlayer on the substrate;
forming a metal structure in the insulating interlayer structure comprising:

forming at least one wiring in the insulating interlayer structure, and forming at least one lower light-shielding layer pattern electrically insulated from the wiring, wherein forming the wiring and lower light-shielding layer pattern comprises;

forming a first trench and a second trench by partially etching the insulating interlayer structure;

forming a conductive layer on the insulating interlayer structure to fill the first and second trenches; and partially removing the conductive layer to form the wiring in the first trench and to form the lower light-shielding layer pattern in the second trench;

forming a dummy pattern at least partially overlapping the metal structure on the insulating interlayer structure; and, forming an upper light-shielding layer pattern at least partially overlapped by the photodiode and enclosing the dummy pattern.

19. The method of claim 18, further comprising:

forming a light-shielding via pattern on the insulating interlayer structure;

wherein the light-shielding via pattern connects the lower light-shielding layer pattern to the upper light-shielding layer pattern so as to at least partially block light passing through the dummy pattern; and, wherein the light-shielding via pattern is formed simultaneously with the upper light-shielding layer pattern.

20. The method of claim 18, further comprising:

before forming the upper light-shielding layer pattern, forming a light-shielding Wherein the light-shielding via pattern connects the lower light-shielding layer pattern to the upper light-shielding layer pattern so as to at least partially block light passing through the dummy pattern.

21. The method of claim 18, wherein forming the dummy pattern comprises:

forming an additional insulating interlayer on the insulating interlayer structure; and, partially etching the additional insulating interlayer to form the dummy pattern; and, forming a third trench at an upper portion of the additional insulating interlayer.

22. The method of claim 21, wherein forming the light-shielding layer pattern comprises:

forming a conductive layer on the etched additional insulating interlayer to fill up the third trench; and, partially removing the conductive layer to form the light-shielding layer pattern in the third trench.

23. The method of claim 22, wherein the conductive layer is formed of a material comprising copper.

24. A method of manufacturing an image sensor, the method comprising:

forming a first photodiode in an optical black area of a substrate;

forming a second photodiode in an optical acceptance area of the substrate;

forming an insulating interlayer structure comprising at least one insulating interlayer on the substrate;

forming wirings in the insulating interlayer structure and offset from the photodiodes;

forming lower light-shielding layer patterns in the insulating interlayer structure, the lower light-shielding layer patterns being at least partially overlapped by the first photodiode and electrically insulated from the wirings;

forming at least one dummy pattern on the insulating interlayer structure and in the optical black area; and, forming an upper light-shielding layer pattern enclosing the dummy pattern, the upper light-shielding layer pattern being at least partially overlapped by the first photodiode.

25. The method of claim 24, wherein a plurality of dummy patterns are formed throughout the insulating interlayer structure.

26. The method of claim 24, wherein forming the wirings and the lower light-shielding layer patterns comprises:

forming first and second trenches by partially etching the insulating interlayer structure;

forming a conductive layer on the insulating interlayer structure to fill up the first and the second trenches; and, partially removing the conductive layer to form the wirings in the first trenches and to form the lower light-shielding layer patterns in the second trenches.

27. The method of claim 26, wherein the dummy pattern is at least partially overlapped by the lower light-shielding layer patterns.

28. The method of claim 27, further comprising:

forming a light-shielding via pattern on the insulating interlayer structure;

wherein the light-shielding via pattern connects the lower light-shielding layer patterns to the upper light-shielding layer pattern so as to at least partially block light passing through the dummy pattern; and, wherein the light-shielding via pattern is formed simultaneously with the upper light-shielding layer pattern.

29. The method of claim 27, further comprising:

before forming the upper light-shielding layer pattern, forming a light-shielding via pattern on the insulating interlayer structure;

wherein the light-shielding via pattern connects the lower light-shielding layer patterns to the upper light-shielding layer pattern so as to at least partially block light passing through the dummy pattern.

30. The method of claim 24, wherein forming the dummy pattern comprises:

forming an additional insulating interlayer on the insulating interlayer structure; and, partially etching the additional insulating interlayer to form the dummy pattern and a third trench at an upper portion of the additional insulating interlayer.

31. The method of claim 30, wherein forming the upper light-shielding layer pattern comprises:

forming a conductive layer on the etched additional insulating interlayer to fill up the third trench; and, partially removing the conductive layer to form the upper light-shielding layer pattern in the third trench.

32. The method of claim 31, wherein the conductive layer is formed of a material comprising copper.

* * * * *